US008878301B2

(12) United States Patent
Hirano

(10) Patent No.: US 8,878,301 B2
(45) Date of Patent: Nov. 4, 2014

(54) SEMICONDUCTOR DEVICE WITH TRANSISTORS HAVING DIFFERENT SOURCE/DRAIN REGION DEPTHS

(75) Inventor: Yuichi Hirano, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 349 days.

(21) Appl. No.: 13/186,163

(22) Filed: Jul. 19, 2011

(65) Prior Publication Data
US 2012/0061767 A1 Mar. 15, 2012

(30) Foreign Application Priority Data
Sep. 9, 2010 (JP) ................................ 2010-201885

(51) Int. Cl.
*H01L 21/70* (2006.01)
*H01L 21/8238* (2006.01)
*H01L 21/8234* (2006.01)

(52) U.S. Cl.
CPC *H01L 21/823456* (2013.01); *H01L 21/823814* (2013.01); *H01L 21/82385* (2013.01); *H01L 21/823418* (2013.01)
USPC ............ 257/369; 257/E27.062; 257/E21.473; 438/527

(58) Field of Classification Search
CPC ...................................................... H01L 27/092
USPC ............ 257/369, E27.062, E21.473; 438/527
See application file for complete search history.

(56) References Cited

U.S. PATENT DOCUMENTS

| 6,586,306 B2 | 7/2003 | Lee et al. |
| 6,902,939 B2* | 6/2005 | Moise et al. ...................... 438/3 |
| 7,217,985 B2 | 5/2007 | Kim |
| 7,495,295 B2 | 2/2009 | Nakanishi et al. |
| 7,888,740 B2* | 2/2011 | Tsutsumi et al. ............. 257/358 |
| 2002/0096712 A1 | 7/2002 | Fukasaku |
| 2003/0042548 A1* | 3/2003 | Maeda et al. .................. 257/369 |

(Continued)

FOREIGN PATENT DOCUMENTS

| JP | 6-252356 A | 9/1994 |
| JP | 8-023031 | 1/1996 |

(Continued)

OTHER PUBLICATIONS

Japanese Office Action issued in Japanese Application No. 2010-201885 dated Feb. 4, 2014., w/English translation.

*Primary Examiner* — Caleb Henry
(74) *Attorney, Agent, or Firm* — McDermott Will & Emery LLP

(57) ABSTRACT

A semiconductor device includes core transistors for forming a logic circuit, and I/O transistors for forming an input/output circuit. A distance from the main surface to a lowermost part of an n-type impurity region NR of the I/O n-type transistor is longer than that from the main surface to a lowermost part of an n-type impurity region NR of the core n-type transistor. A distance from the main surface to a lowermost part of a p-type impurity region PR of the I/O p-type transistor is longer than that from the main surface to a lowermost part of a p-type impurity region of the core p-type transistor. A distance from the main surface to the lowermost part of the n-type impurity region of the I/O n-type transistor is longer than that from the main surface to the lowermost part of the p-type impurity region of the I/O p-type transistor.

12 Claims, 29 Drawing Sheets

(56) References Cited

U.S. PATENT DOCUMENTS

| | | | |
|---|---|---|---|
| 2003/0155618 A1* | 8/2003 | Boissonnet et al. | 257/369 |
| 2004/0232494 A1* | 11/2004 | Nagano et al. | 257/382 |
| 2006/0071278 A1* | 4/2006 | Takao | 257/365 |
| 2006/0246647 A1* | 11/2006 | Visokay et al. | 438/199 |
| 2006/0246651 A1* | 11/2006 | Chambers et al. | 438/216 |
| 2007/0138568 A1* | 6/2007 | Nagano et al. | 257/369 |
| 2007/0141772 A1* | 6/2007 | Nagano et al. | 438/199 |
| 2007/0241402 A1* | 10/2007 | Hirano | 257/347 |
| 2008/0057645 A1* | 3/2008 | Lin et al. | 438/257 |
| 2008/0105923 A1* | 5/2008 | Sakai et al. | 257/336 |
| 2008/0179676 A1* | 7/2008 | Hirano et al. | 257/350 |
| 2008/0252634 A1* | 10/2008 | Sato et al. | 345/211 |
| 2009/0108370 A1* | 4/2009 | Tsukamoto | 257/369 |
| 2009/0242994 A1* | 10/2009 | Nallapati et al. | 257/368 |
| 2010/0314686 A1* | 12/2010 | Hirano | 257/351 |
| 2013/0071990 A1* | 3/2013 | Hashim et al. | 438/396 |

FOREIGN PATENT DOCUMENTS

| | | |
|---|---|---|
| JP | 2000-311950 | 11/2000 |
| JP | 2002-217307 | 8/2002 |
| JP | 2002-359253 | 12/2002 |
| JP | 2002-368123 | 12/2002 |
| JP | 2005-252263 | 9/2005 |
| JP | 2006-210793 | 8/2006 |
| JP | 2008103417 A | 5/2008 |
| JP | 2010-171115 A | 8/2010 |

* cited by examiner

SEMICONDUCTOR DEVICE WITH TRANSISTORS HAVING DIFFERENT SOURCE/DRAIN REGION DEPTHS

CROSS-REFERENCE TO RELATED APPLICATIONS

The disclosure of Japanese Patent Application No. 2010-201885 filed on Sep. 9, 2010 including the specification, drawings and abstract is incorporated herein by reference in its entirety.

BACKGROUND

The present invention relates to semiconductor devices and manufacturing methods thereof, and more specifically, to a semiconductor device including a semiconductor element for forming a logic circuit, and another semiconductor element for forming an input/output circuit, and a manufacturing method thereof.

A microcomputer is taken as an example of semiconductor devices incorporating a flash memory and a central processing unit (CPU). The microcomputer generally has a number of metal oxide semiconductor (MOS) transistors formed over a semiconductor substrate.

The MOS transistors formed over the semiconductor substrate of the microcomputer include, for example, a core transistor for forming a logic circuit, such as a CPU or a memory, and an I/O transistor for forming an input/output circuit electrically coupled to other semiconductor devices.

For example, the following Patent Documents 1 to 7 disclose semiconductor devices including a plurality of types of transistors formed over the same semiconductor substrate, like the above-mentioned core transistor and I/O transistor.

The core transistor and the I/O transistor are formed over the same semiconductor substrate. However, both transistors differ from each other in power required to drive each of the transistors. In some cases, a voltage of 7 V or more is applied to between a source and a drain, for example, even in the I/O transistor for a 5-V system during burn-in.

In this case, a leak current is more likely to be generated between a support substrate and a silicide region, for example, which is formed by siliciding parts of the source region or drain region by heat treatment. This is because a depletion layer is likely to come into contact with the silicide region of the drain region due to a large voltage applied to the drain region.

Each of Patent Documents 1 to 4 discloses a semiconductor device having a structure with a deep source/drain region (LDD region, impurity diffusion layer) of the I/O transistor as compared to the core transistor. The term "deep" means that a distance between one main surface of the semiconductor substrate and the lowermost part of the source/drain region is long. This arrangement can increase the distance between the silicide region formed in the vicinity of the surface of the source/drain region and a depletion layer upon applying a drain voltage to the I/O transistor, which can suppress the generation of the leak current between the silicide region and the depletion layer.

The technique disclosed in Patent Document 5 involves making a difference in concentration of impurities of a source/drain region (impurity layer) between a core transistor and an I/O transistor, taking into consideration the difference in performance between the core transistor (MOSFET of a logic unit) and the I/O transistor.

Patent Documents 6 and 7 disclose a semiconductor device in which a source/drain region (junction region or the like) of a MOS transistor having a high dielectric breakdown voltage or high breakdown-voltage characteristics is formed more deeply than a source/drain region of a MOS transistor having a low dielectric breakdown voltage or low breakdown-voltage characteristics.

RELATED ART DOCUMENTS

Patent Documents

[Patent Document 1]
Japanese Unexamined Patent Publication No. 2002-217307
[Patent Document 2]
Japanese Unexamined Patent Publication No. 2006-210793
[Patent Document 3]
Japanese Unexamined Patent Publication No. Hei. 8 (1996)-23031
[Patent Document 4]
Japanese Unexamined Patent Publication No. 2002-359253
[Patent Document 5]
Japanese Unexamined Patent Publication No. 2000-311950
[Patent Document 6]
Japanese Unexamined Patent Publication No. 2005-252263
[Patent Document 7]
Japanese Unexamined Patent Publication No. 2002-368123

SUMMARY

In transistors included in related art semiconductor devices, however, boron as an impurity contained in a semiconductor substrate is likely to be absorbed into an interface between a support substrate (silicon) and an oxide film after being implanted into a LDD region or source/drain region. That is, a phenomenon called segregation will occur in which impurities, such as boron, contained in the semiconductor substrate accumulate at the interface between the silicon and the oxide film.

In the case of segregation of the boron at the interface between the silicon and the oxide film, the drain region is made narrower (shallower) by the area of the segregation. Then, a distance between the silicide region formed in the drain region and the depletion layer becomes short. As a result, when driving the transistor by applying the drain voltage thereto, the leak current is more likely to be generated between the silicide region and the support substrate.

The above-mentioned segregation and leak current together therewith are more likely to be generated in an n-type MOSFET containing boron as the impurity in the substrate as compared to a p-type MOSFET. Each of the above patent documents, however, fails to disclose the technique for suppressing the generation of the leak current due to the segregation in the semiconductor device including a combination of the n-type MOSFET and the p-type MOSFET.

The present invention has been made in view of the forgoing problems. Accordingly, it is an object of the invention to provide a semiconductor device including a semiconductor element (transistor) that can suppress the generation of the leak current between the drain region and the support substrate due to the segregation of impurities, and a manufacturing method thereof.

A semiconductor device according to one aspect of the invention includes the following arrangement. The semiconductor device includes a semiconductor substrate with a main surface; an n-channel first transistor and a p-channel second transistor formed over the main surface and adapted to form a logic circuit; and an n-channel third transistor and a p-channel fourth transistor formed over the main surface and adapted to form an input/output circuit. The first and third transistors have n-type impurity regions, and the second and fourth transistors have p-type impurity regions. A distance from the main surface to a lowermost part of the impurity region of the third transistor is longer than that from the main surface to a lowermost part of the impurity region of the first transistor. A distance from the main surface to a lowermost part of the impurity region of the fourth transistor is longer than that from the main surface to a lowermost part of the impurity region of the second transistor. A distance from the main surface to the lowermost part of the impurity region of the third transistor is longer than that from the main surface to the lowermost part of the impurity region of the fourth transistor.

A manufacturing method of a semiconductor device according to another aspect of the invention includes the following steps. First, a semiconductor substrate with a main surface is prepared. Then, first and second transistors for forming a logic circuit are formed over the main surface. Further, third and fourth transistors for forming an input/output circuit are formed over the main surface. The step of forming the first and third transistors includes the step of forming n-type impurity regions. The step of forming the second and fourth transistors includes the step of forming p-type impurity regions. A distance from the main surface to a lowermost part of the impurity region of the third transistor is longer than that from the main surface to a lowermost part of the impurity region of the first transistor. A distance from the main surface to a lowermost part of the impurity region of the fourth transistor is longer than that from the main surface to a lowermost part of the impurity region of the second transistor. A distance from the main surface to the lowermost part of the impurity region of the third transistor is longer than that from the main surface to the lowermost part of the impurity region of the fourth transistor.

In the above-mentioned semiconductor device of the invention, the impurity region (drain region) of the semiconductor element (I/O transistor) for forming the input/output circuit is deeper than the impurity region of the semiconductor element (core transistor) for forming the logic circuit. Further, the n-type impurity region of the n-type semiconductor element (n-type MOS transistor) for forming the input/output circuit is deeper than the p-type impurity region of the p-type semiconductor element (p-type MOS transistor) for forming the input/output circuit. When the drain region of the I/O transistor is subjected to a higher voltage than the drain region of the core transistor, a distance between the drain region and a depletion layer formed in the vicinity of the drain region of the I/O transistor becomes longer. Thus, the generation of the leak current due to the high voltage at the drain region is suppressed between the depletion layer and the drain region of the I/O transistor. The n-type impurity region of the n-type MOS transistor which is most likely to cause segregation as compared to other components of the input/output circuit is deeper than the p-type impurity region of the p-type MOS transistor, which reduces the possibility that the impurity region becomes excessively shallow even in the case of the segregation in the n-type transistor. This arrangement suppresses the generation of the leak current at the drain region due to the segregation of the n-type MOS transistor.

As mentioned above, the semiconductor device according to the invention can suppress the generation of the leak current at the drain region. The above manufacturing method of the semiconductor device according to the invention is used to form the semiconductor device of the invention described above. The use of the manufacturing method can provide a semiconductor device capable of suppressing the generation of leak current at the drain region.

DETAILED DESCRIPTION

Preferred embodiments of the invention will be described below with reference to the accompanying drawings.

First Embodiment

First, a semiconductor device in the form of wafer according to this embodiment will be described hereinafter.

Figure 1:
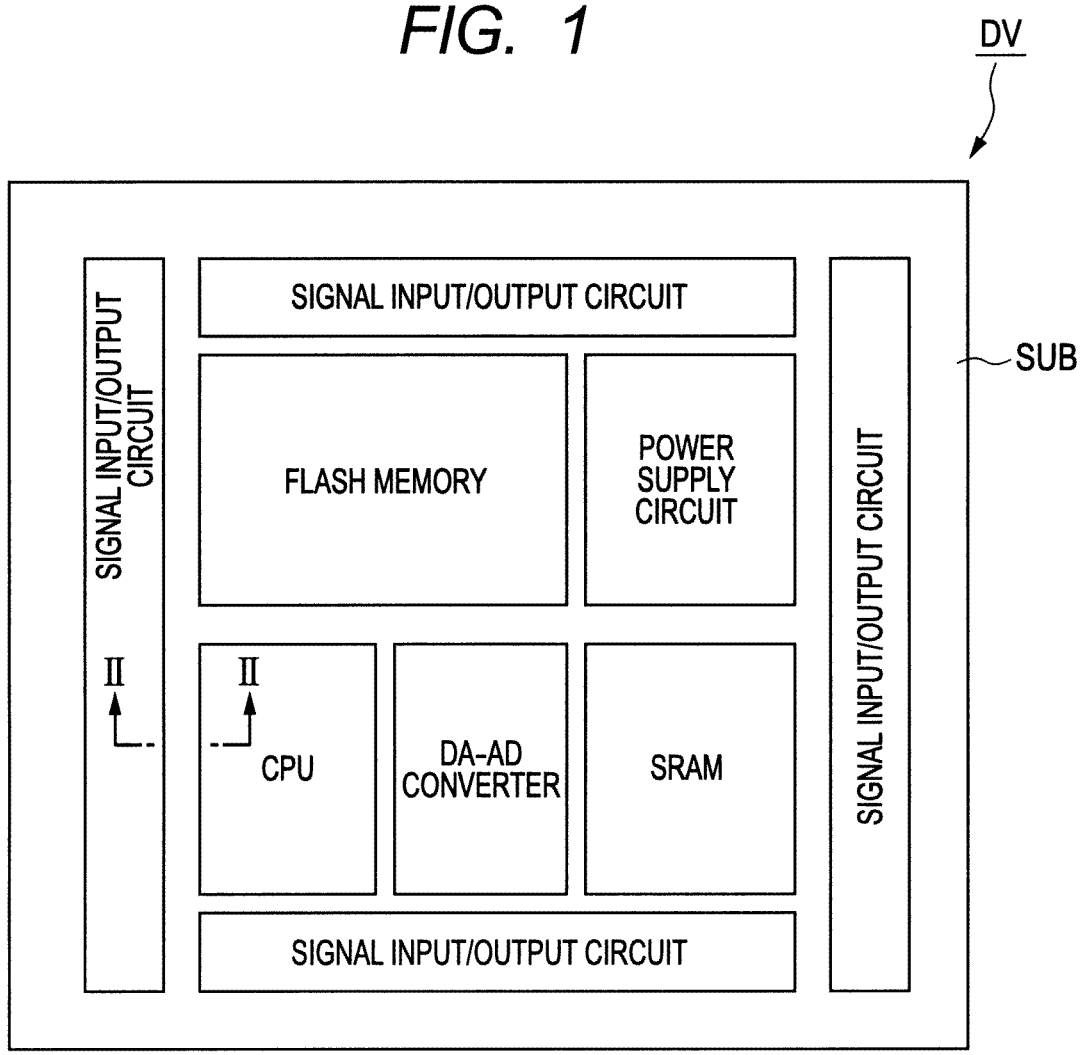
FIG. 1 is a schematic plan view showing the state of a wafer of a semiconductor device according to a first embodiment of the invention.

Referring to FIG. 1, a semiconductor device DV of this embodiment includes a plurality of types of circuits formed over a main surface of a semiconductor substrate SUB, such as a semiconductor wafer. Suitable circuits for forming the semiconductor device DV include, by way of example, a signal input/output circuit, a DA-AD converter, a power supply circuit, a CPU, a flash memory, and a static random access memory (SRAM).

Each circuit included in the semiconductor device DV plays the following roles. The signal input/output circuit performs input and output of electric signals with respect to a circuit disposed outside the semiconductor device DV. The DA-AD converter converts between analog and digital signals. The power supply circuit supplies power required for driving the semiconductor device DV, and controls the power. The CPU performs logic computation by use of a logic circuit. The flash memory and the SRAM store data therein.

These circuits each are comprised of a switching element including a MOS transistor as a principal component. Among them, the transistor forming the CPU or SRAM is a core transistor serving as the logic circuit. The transistor forming the signal input/output circuit, the DA-AD converter, the power supply circuit, or the flash memory is an I/O transistor serving as the input/output circuit.

Figure 2:
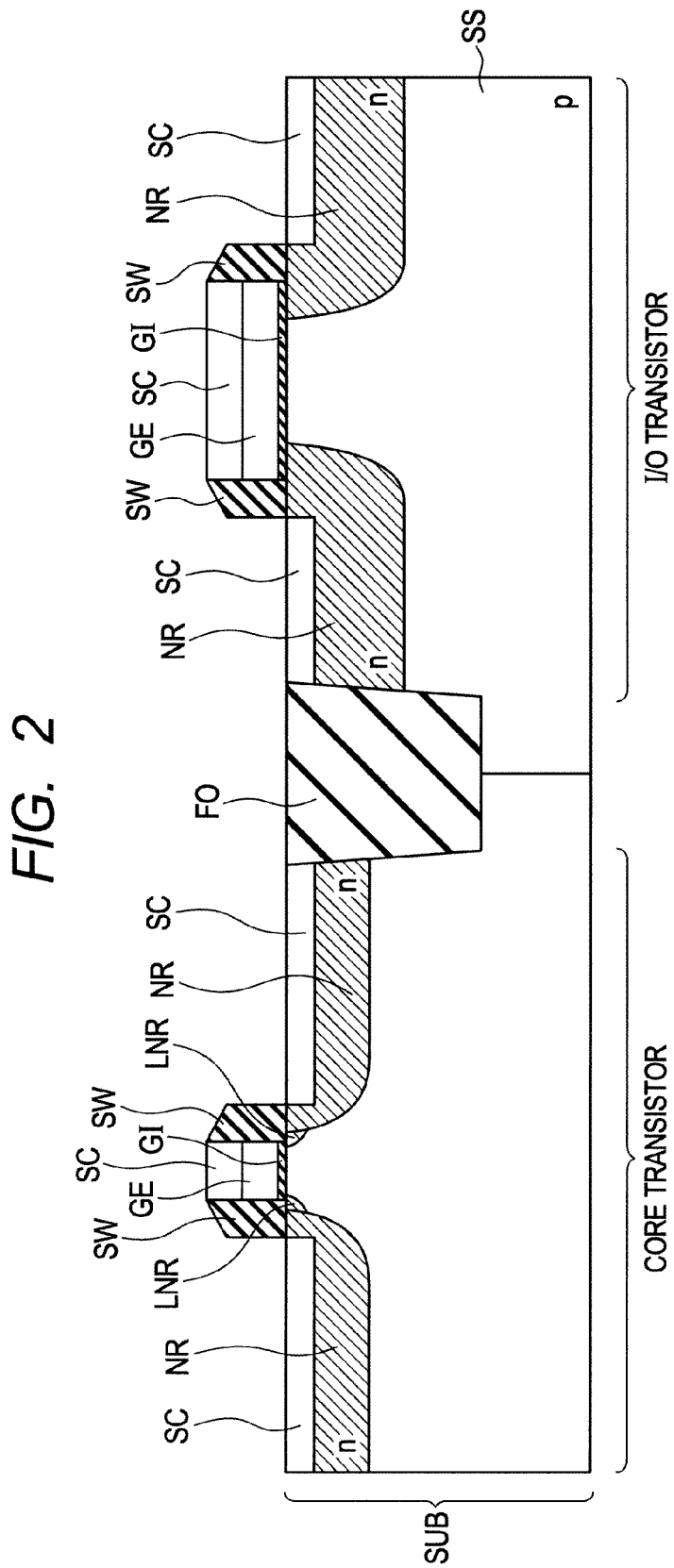
FIG. 2 is a schematic cross-sectional view of apart taken along the line II-II of FIG. 1.

The cross-sectional view of the part taken along the line II-II of FIG. 1 straddles the I/O transistor forming the signal input/output circuit, and the core transistor forming the CPU. As shown in FIG. 2, the I/O transistor and the core transistor are arranged in parallel to each other. Referring to FIG. 2, for example, the core transistor and the I/O transistor formed over the main surface of the semiconductor substrate SUB are isolated from each other by a field oxide film FO. That is, the region with the core transistor formed therein and the region with the I/O transistor formed therein are preferably isolated from each other by the field oxide film FO over the main surface of the semiconductor substrate SUB. The field oxide film FO is preferably formed of, for example, a silicon oxide ($SiO_2$) film.

The semiconductor substrate SUB is preferably comprised of, for example, silicon single crystal. A support substrate SS of the semiconductor substrate SUB may be of either an n-type or a p-type. As shown in FIG. 2, the support substrate SS is comprised of p-type silicon single crystal, and the core transistor and the I/O transistor each are comprised of the n-type MOS transistor.

Each of the core transistor and the I/O transistor includes a pair of n-type impurity regions NR and a gate electrode GE. A pair of n-type impurity regions NR respectively forms a source region and a drain region of the MOS transistor. During driving the MOS transistor, a voltage is applied to the drain region with respect to the source region. In the normal driving operation, for example, a voltage of not less than 1.0 V nor more than 1.8 V is applied to the core transistor, whereas a voltage of 5 V is applied to the I/O transistor. During the burn-in, a voltage of 7 V is often applied to the I/O transistor.

Such an n-type impurity region NR is an impurity diffusion layer formed by diffusing impurity atoms, such as arsenic (As) or phosphorus (P), into a silicon single crystal. The gate electrode GE is comprised of, for example, polycrystal silicon.

A gate insulating film GI comprised of, for example, a silicon oxide film is formed between the gate electrode GE and the main surface of the semiconductor substrate SUB. Sidewall insulating films SW are formed of, for example, a silicon oxide film, so as to cover the sides of the gate insulating film GI and the gate electrode GE.

The n-type impurity region NR in each of the core transistor and the I/O transistor is disposed to be embedded in the support substrate SS from one (upper side) main surface of the semiconductor substrate SUB. A low concentration n-type impurity region LNR is formed so as to extend from the n-type impurity region NR of the core transistor toward the side of the gate electrode GE and the gate insulating film GI.

A silicide SC is formed over the n-type impurity region NR and the gate electrode GE in each of the core transistor and the I/O transistor. The silicide SC is formed to extend from a region with silicon exposed thereto, for example, a surface of the n-type impurity region NR or gate electrode GE, up to a certain depth in the direction intersecting the surface, for example, by reacting silicon with cobalt (Co) or nickel (Ni).

Figure 3:
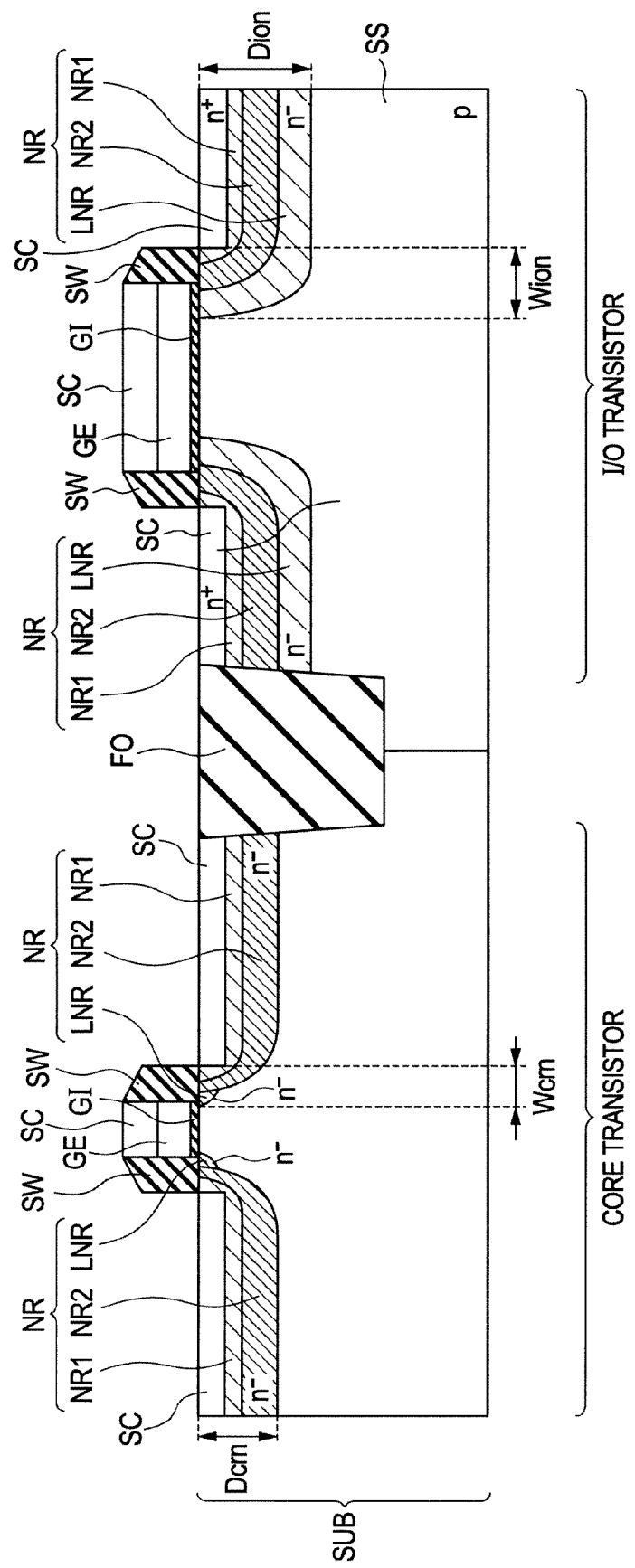
FIG. 3 is a schematic cross-sectional view showing the more detailed structure of an n-type impurity region shown in FIG. 2.

Referring to FIG. 3, the n-type impurity region NR of each transistor shown in FIG. 2 includes n-type impurity regions NR1 and NR2 and the low concentration n-type impurity region LNR. The impurity regions LNR and NR2 are regions having an impurity concentration lower than that of the n-type impurity region NR1. The low concentration n-type impurity region LNR of the core transistor is formed to protrude from the n-type impurity regions NR1 and NR2 (under the gate insulating film GI). Even in both the core transistor and the I/O transistor, for example, the n-type impurity region NR1 contains arsenic impurities, and the n-type impurity region NR2 contains phosphorus impurities. Preferably, the low concentration n-type impurity region LNR of the core transistor contains, for example, arsenic impurities, and the low concentration n-type impurity region LNR of the I/O transistor contains, for example, phosphorus impurities. However, this is one example, and thus the n-type impurity region may contain other impurities.

Alternatively, the n-type impurity region may contain, for example, both the arsenic impurities and the phosphorus impurities.

As shown in FIG. 3, the silicide SC is formed only in the n-type impurity region NR1, but may be formed, for example, in at least a part of the n-type impurity region NR2 or the low concentration n-type impurity region LNR.

This embodiment has the following relationship regarding the depth or distance from the main surface (uppermost surface shown in FIG. 3) of the n-type impurity region NR up to the lowermost part. That is, the depth $D_{ion}$ of the n-type impurity region of the I/O transistor is larger than the depth $D_{crn}$ of the n-type impurity region of the core transistor. Further, this embodiment has the following relationship regarding the width or distance from the end of the silicide SC in the n-type impurity region NR (the end on the gate insulating film GI side in the lateral direction of FIG. 3) to the end of the n-type impurity region NR. The above width $W_{ion}$ of the I/O transistor is larger than the above width $W_{crn}$ of the core transistor.

As shown in FIGS. 2 and 3, the width (in the lateral direction) of the gate electrode GE of the I/O transistor is larger than that of the core transistor. This is to surely prevent a pinch-off phenomenon or punch-through phenomenon, which is more likely to be generated under the gate electrode with a small width, because a high drain voltage is applied to the I/O transistor as compared to the core transistor.

Each circuit included in the semiconductor device DV as shown in FIG. 1 has a plurality of n-channel MOS transistors and p-channel MOS transistors, and thus is structured as the so-called complementary metal oxide semiconductor (CMOS). Thus, the circuits in the semiconductor device DV include the I/O n-type transistor (see FIG. 4), the I/O p-type transistor (see FIG. 5), the core n-type transistor (see FIG. 6), and the core p-type transistor (see FIG. 7).

Figure 4:
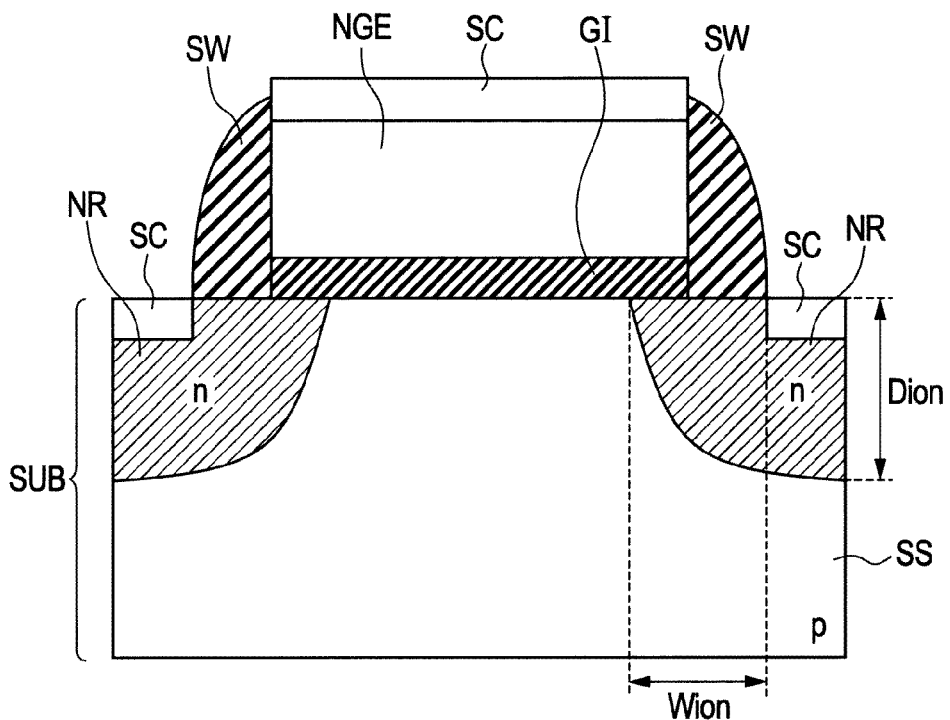
FIG. 4 is a schematic cross-sectional view showing an I/O n-type MOS transistor structure included in the semiconductor device according to the first embodiment.
Figure 5:
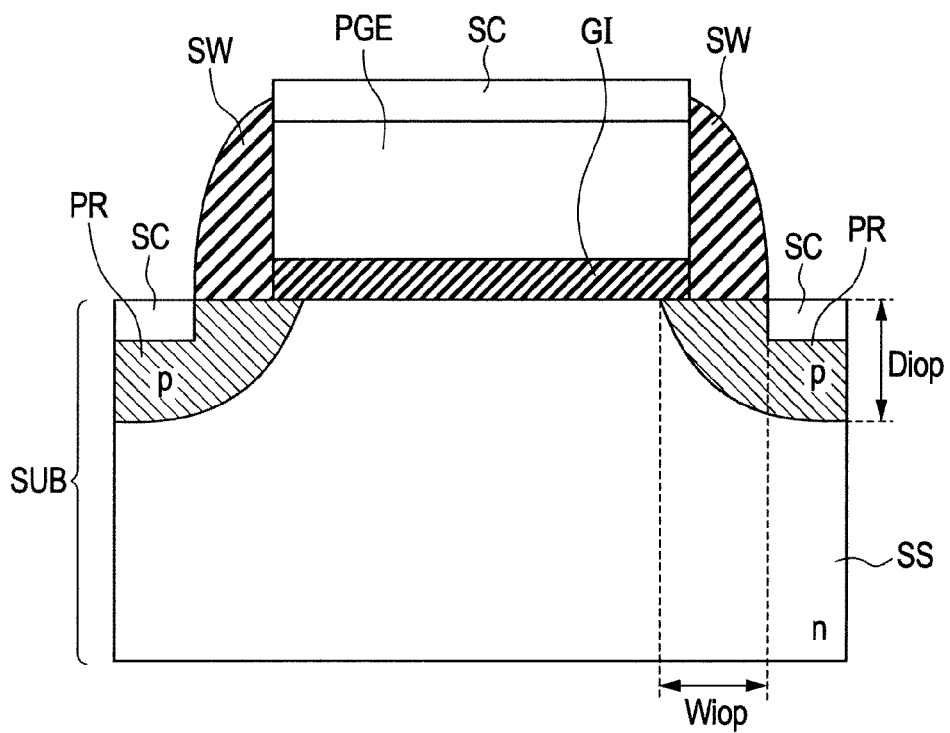
FIG. 5 is a schematic cross-sectional view showing an I/O p-type MOS transistor structure included in the semiconductor device according to the first embodiment.

Referring to FIGS. 4 and 5, in the I/O n-type transistor (third transistor), the n-type impurity regions NR are formed in the p-type support substrate SS like the I/O n-type transistor shown in FIG. 2. In the I/O p-type transistor (fourth transistor), the p-type impurity regions PR are formed, for example, in the n-type support substrate SS.

The gate electrode shown in FIG. 4 is an n-type gate electrode NGE comprised of, for example, n-type polycrystal silicon. The gate electrode shown in FIG. 5 is a p-type gate electrode PGE comprised of, for example, p-type polycrystal silicon. As will be described later, the n-type MOS transistor may also use the p-type gate electrode PGE. Further, the p-type MOS transistor may also use the n-type gate electrode NGE.

Figure 6:
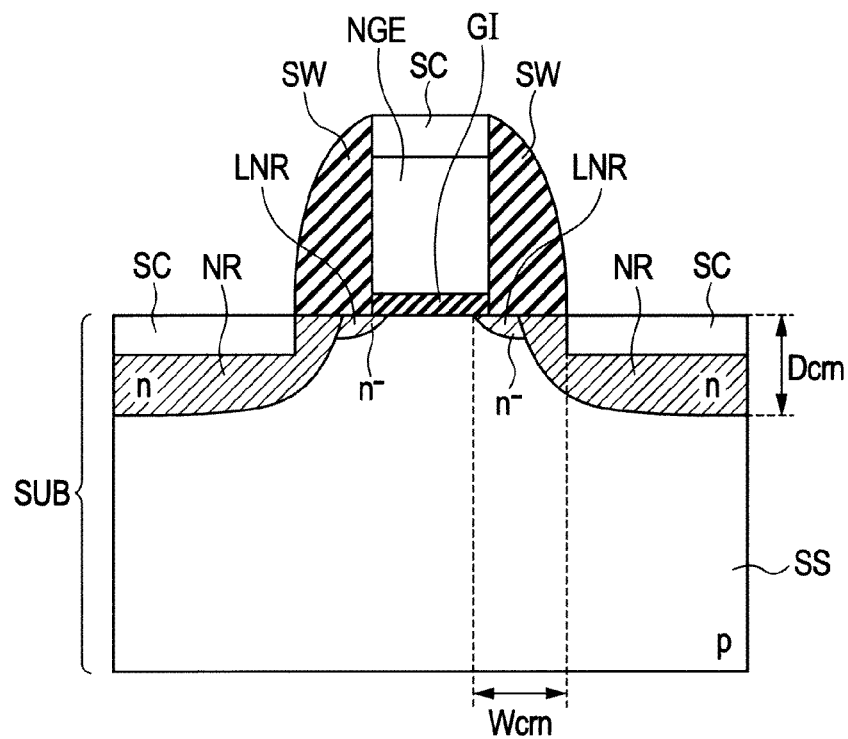
FIG. 6 is a schematic cross-sectional view showing a core n-type MOS transistor structure included in the semiconductor device according to the first embodiment.
Figure 7:
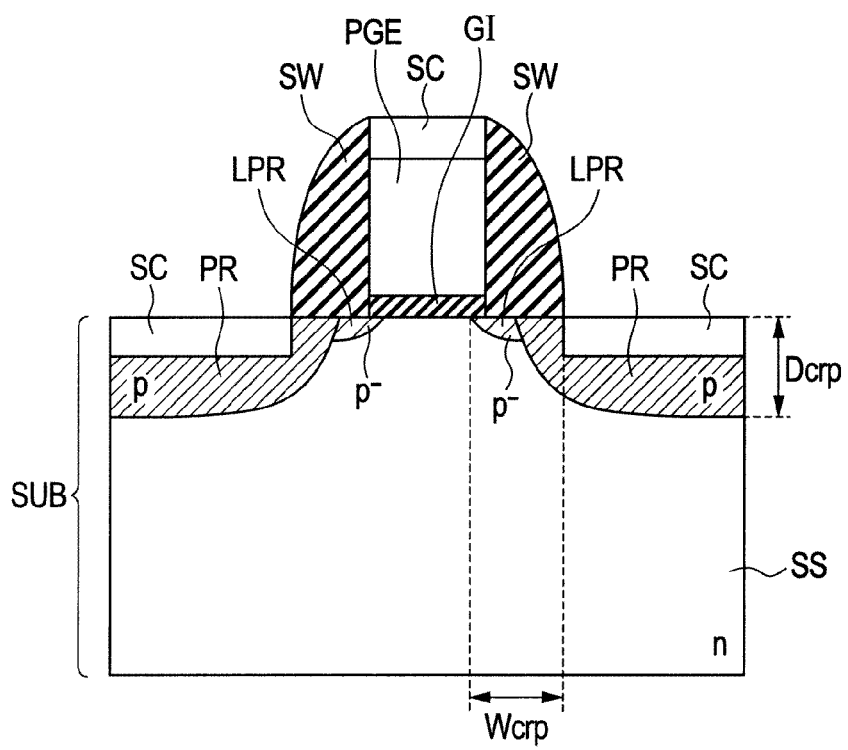
FIG. 7 is a schematic cross-sectional view showing a core p-type MOS transistor structure included in the semiconductor device according to the first embodiment.

Referring to FIGS. 6 and 7, in the core n-type transistor (first transistor), the n-type impurity regions NR are formed in the p-type support substrate SS, like the core n-type transistor shown in FIG. 2. In the core p-type transistor (second transistor), the p-type impurity regions PR are formed, for example, in the n-type support substrate SS.

As mentioned above as to the n-type impurity region NR, the depth $D_{ion}$ of the n-type impurity region of the I/O transistor is larger than the depth $D_{crn}$ of the n-type impurity region of the core transistor. This embodiment has the following relationship regarding the distance (width) from the end of the silicide SC in the n-type impurity region NR to the end of the n-type impurity region NR. The above width $W_{ion}$ of the I/O transistor is larger than the above width $W_{crn}$ of the core transistor.

As to the p-type impurity region PR, the depth $D_{ion}$ of the p-type impurity region of the I/O transistor is larger than the width $D_{crn}$ of the p-type impurity region of the core transistor. As to the distance (width) from the end of the silicide SC in the p-type impurity region PR to the end of the p-type impurity region PR, the above width $W_{ion}$ of the I/O transistor is larger than the above width $W_{crn}$ of the core transistor.

Figure 8:
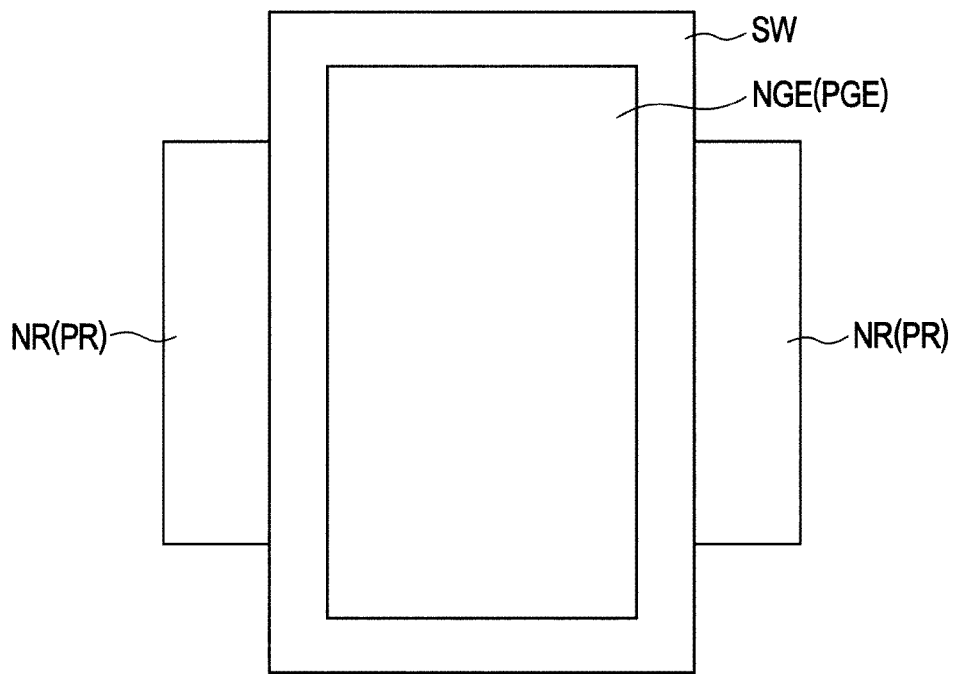
FIG. 8 is a top view showing the I/O transistor structure shown in FIGS. 4 and 5.
Figure 9:
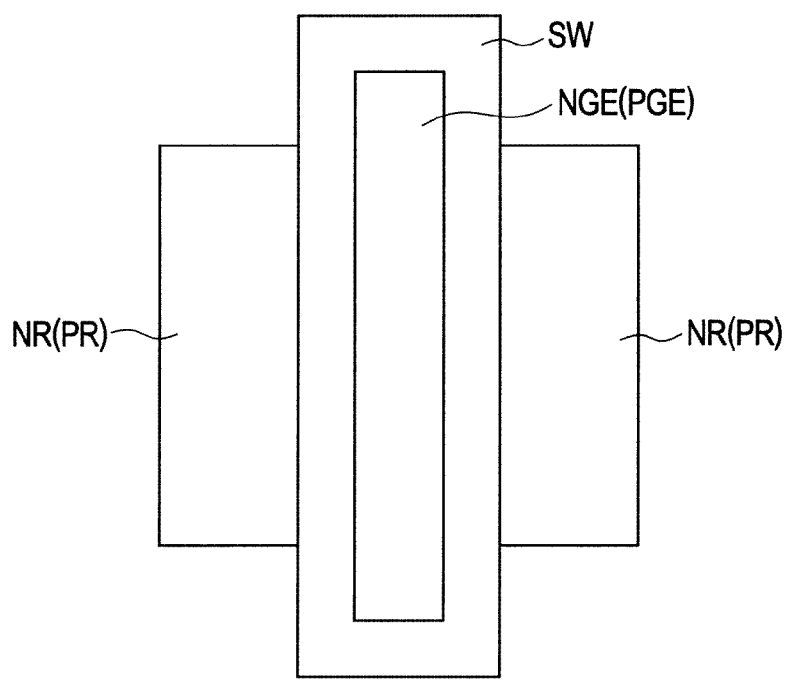
FIG. 9 is a top view showing the core transistor structure shown in FIGS. 6 and 7.

FIG. 8 is a schematic diagram of the I/O transistor shown in FIGS. 4 and 5 as viewed from the above. FIG. 9 is a schematic diagram of the core transistor shown in FIGS. 6 and 7 as viewed from the above. As shown in these figures, the MOS transistor of this embodiment preferably has a rectangular pattern shape in planar view.

Figure 10:
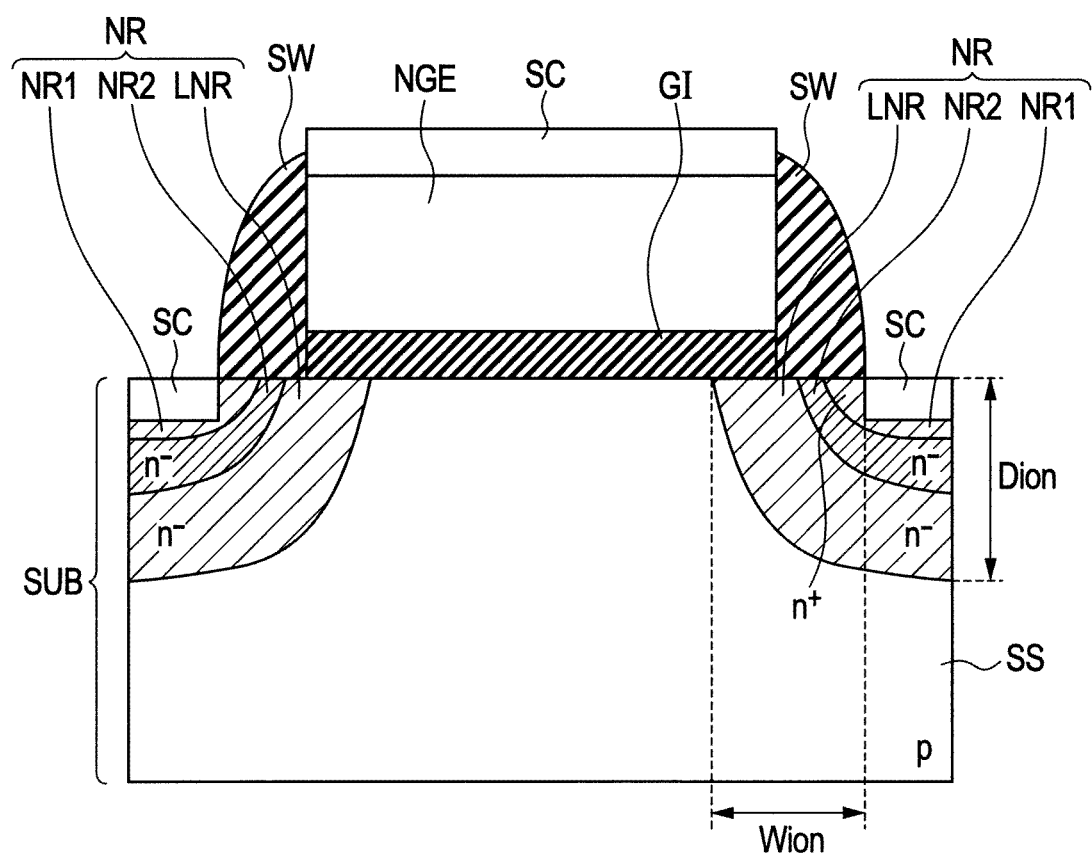
FIG. 10 is a schematic cross-sectional view showing the more detailed structure of an n-type impurity region in the I/O n-type MOS transistor shown in FIG. 4.
Figure 11:
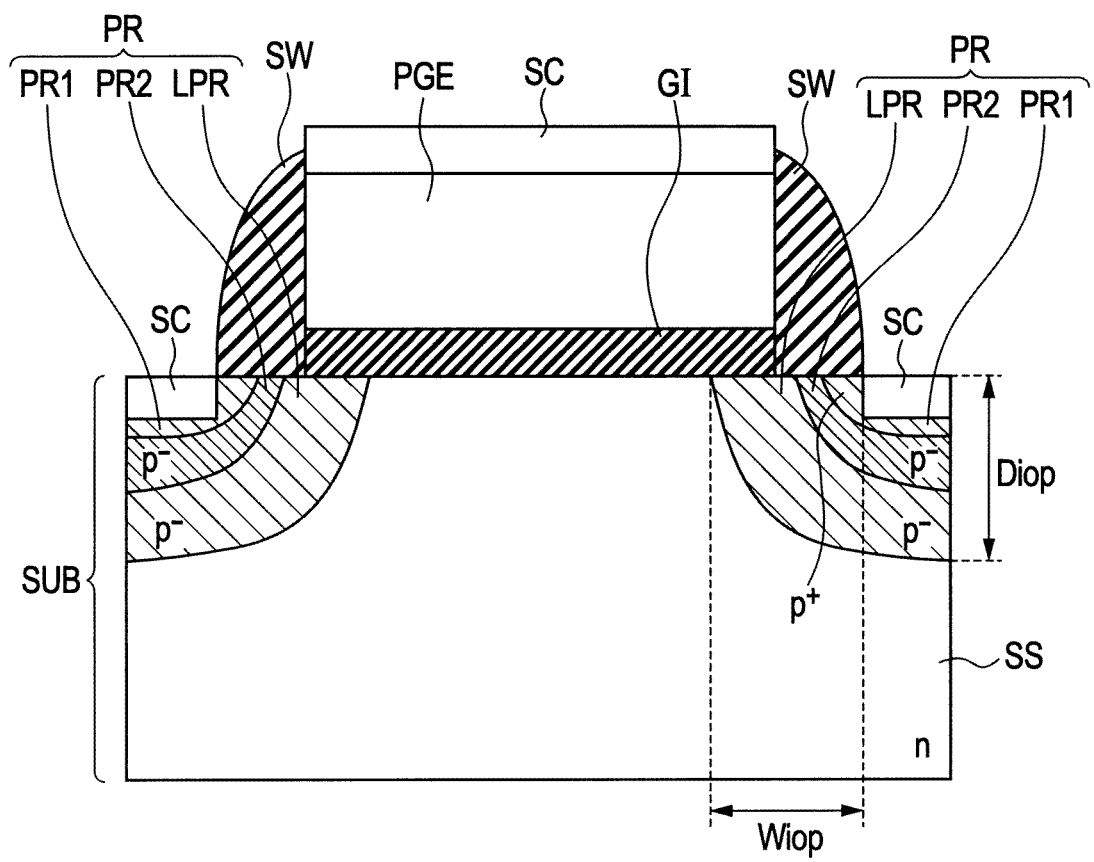
FIG. 11 is a schematic cross-sectional view showing the more detailed structure of a p-type impurity region in the I/O p-type MOS transistor shown in FIG. 5.

Referring to FIG. 10, in the I/O n-type transistor, each n-type impurity region NR has n-type impurity regions NR1 and NR2, and a low concentration n-type impurity region LNR, like the I/O n-type transistor shown in FIG. 3. Referring to FIG. 11, in the I/O p-type transistor, each p-type impurity region PR has p-type impurity regions PR1 and PR2, and a low concentration p-type impurity region LPR. Further, referring to FIG. 12, in the core n-type transistor, each n-type impurity region NR has n-type impurity regions NR1 and NR2, and a low concentration n-type impurity region LNR, like the core n-type transistor shown in FIG. 3. Referring to FIG. 13, in the core p-type transistor, each p-type impurity region PR has p-type impurity regions PR1 and PR2, and a low concentration p-type impurity region LPR.

Figure 12:
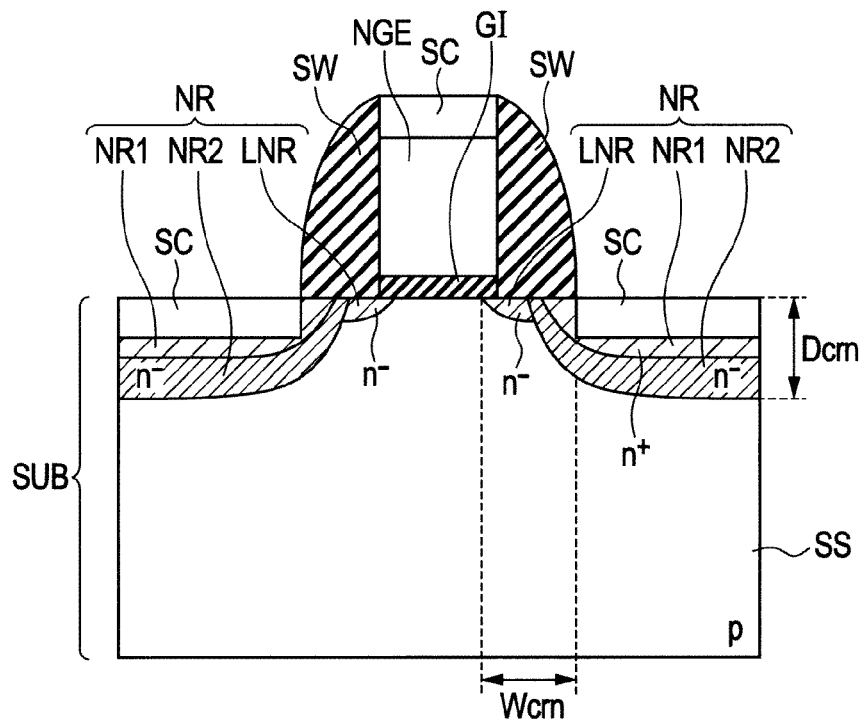
FIG. 12 is a schematic cross-sectional view showing the more detailed structure of the n-type impurity region of the core n-type MOS transistor shown in FIG. 6.
Figure 13:
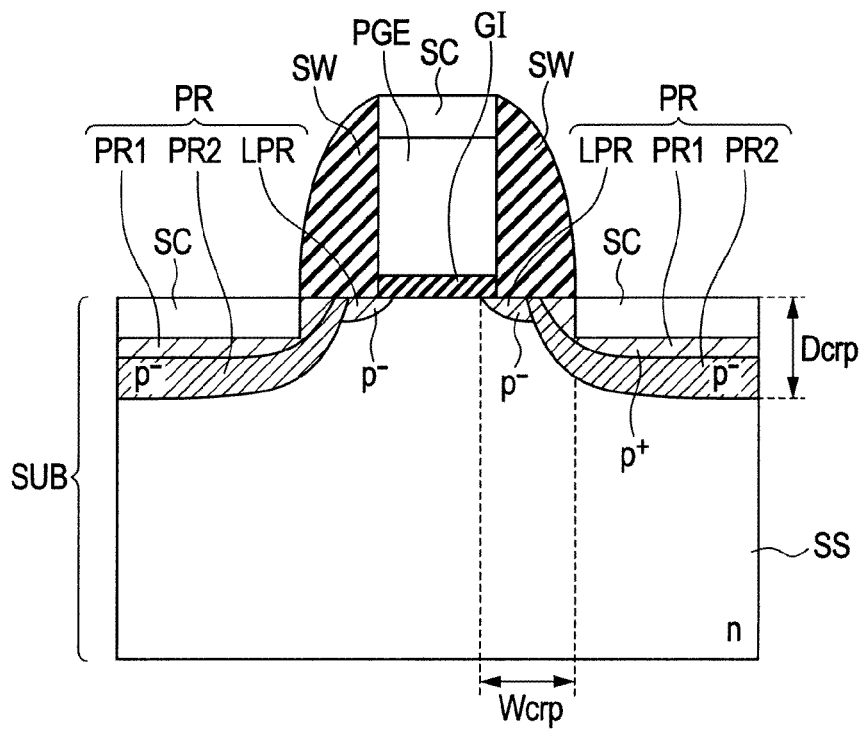
FIG. 13 is a schematic cross-sectional view showing the more detailed structure of the p-type impurity region in the core p-type MOS transistor shown in FIG. 7.

The impurity regions LNR and NR2 shown in FIG. 12 are regions having an impurity concentration lower than that of the n-type impurity region NR1. Likewise, the impurity regions LPR and PR2 shown in FIG. 13 are regions having an impurity concentration lower than that of the p-type impurity region PR1. The impurity regions LNR and LPR of the core transistor are formed to protrude from the impurity regions NR1, NR2, PR1, and PR2 (under the gate insulating film GI). The p-type impurity regions PR1 and PR2, and the low concentration p-type impurity region LPR in each of the core transistor and the I/O transistor preferably contain boron (B) and a boron compound. Such impurity regions, however, may be comprised of other impurities containing, for example, indium (In). The impurity regions may contain, for example, both boron impurities and indium impurities.

As shown in FIGS. 10 to 13, the silicide SC is formed only in the p-type impurity region PR1, but may be formed in at least a part of the p-type impurity region PR2 or a low concentration p-type impurity region LPR.

In this embodiment, the depth $D_{crn}$ may be substantially the same as the depth $D_{crp}$ by comparison between FIG. 12 and FIG. 13. Further, the width $W_{crn}$ may be substantially the same as the width $W_{crp}$. That is, the core transistor shown in FIG. 12 differs from the transistor shown in FIG. 13 only in the type of conduction, namely, n-type or p-type. However, the core transistors shown in FIGS. 12 and 13 may have the same size, shape, and the like of each region.

Preferably, in this embodiment, the depth $D_{ion}$ is larger than the depth $D_{crn}$. Specifically, the depth $D_{ion}$ is preferably 1.4 or more times larger than the depth $D_{crn}$. The depth $D_{iop}$ is preferably larger than the depth $D_{crp}$. Specifically, the depth $D_{iop}$ is preferably 1.15 or more times larger than the depth $D_{crp}$.

The depth $D_{ion}$ is set 1.4 or more times larger than the depth $D_{crn}$, which can suppress the leak current due to the drain voltage applied to the I/O n-type MOS transistor, regardless of the depth of the silicide SC, the state of an uneven surface of the silicide SC, and the like. Likewise, the depth $D_{ion}$ is set 1.15 or more times larger than the depth $D_{crn}$, which can suppress the leak current due to the drain voltage applied to the I/O p-type MOS transistor, regardless of the depth of the silicide SC, the state of an uneven surface of the silicide SC, and the like.

In this embodiment, the depth $D_{ion}$ is preferably larger than the depth $D_{iop}$. For example, when the depth $D_{crn}$ is the same as the depth $D_{crp}$, the depth $D_{ion}$ is 1.4 or more times larger than the depth $D_{crn}$, and the depth $D_{iop}$ is 1.15 or more times larger than the depth $D_{crp}$, the $D_{ion}$ is essentially larger than the depth $D_{iop}$. Also, the width $W_{ion}$ is preferably larger than the width $W_{iop}$.

As mentioned above, among four types of MOS transistors shown in FIGS. 10 to 13, the depth $D_{ion}$ of the n-type impurity region NR of the I/O n-type MOS transistor shown in FIG. 10 is the largest, and the depth $D_{iop}$ of the p-type impurity region PR of the I/O p-type MOS transistor shown in FIG. 11 is the second largest. In order to make the depth $D_{ion}$ or depth $D_{iop}$ more than other depths, the n-type impurity region NR or p-type impurity region PR of the I/O transistor shown in FIGS. 10 and 11 may differ in structure from the n-type or p-type impurity region of the core transistor shown in FIGS. 12 and 13.

Specifically, in the n- or p-type impurity region shown in FIGS. 12 to 13, the low concentration n-type (or p-type) impurity region LNR (or LPR) is shallower than the n-type (or p-type) impurity region NR (PR). In contrast, in the n-type impurity region NR shown in FIGS. 10 and 11, the low concentration n-type impurity region LNR is deeper than the n-type impurity regions NR1 and NR2. In this way, the low concentration n-type impurity region LNR is formed deeply, which can form the entire n-type impurity region NR more deeply.

It is noted that the magnitude relationship between the depth $D_{ion}$ of the entire n-type impurity region NR shown in FIG. 10 and the depth $D_{crn}$ of the entire n-type impurity region NR shown in FIG. 12 should have the above-mentioned relationship in terms of depth. However, the magnitude relationship between the depths of respective impurity regions included in the above regions is arbitrary. That is, for example, when comparing the n-type impurity region NR1 shown in FIG. 10 with the n-type impurity region NR1 shown in FIG. 12, the n-type impurity region NR1 shown in FIG. 12 may be deeper than the n-type impurity region NR1 shown in FIG. 10. The same goes for the n-type impurity region NR2, and the low concentration n-type impurity region LNR.

As mentioned above, the depth of the n-type impurity region NR means the distance from the main surface of the semiconductor substrate SUB with the n-type impurity region NR formed to the lowermost part of the n-type impurity region NR in the direction vertical to the main surface of the substrate SUB. This will be described below in more detail with reference to FIG. 14.

Figure 14:
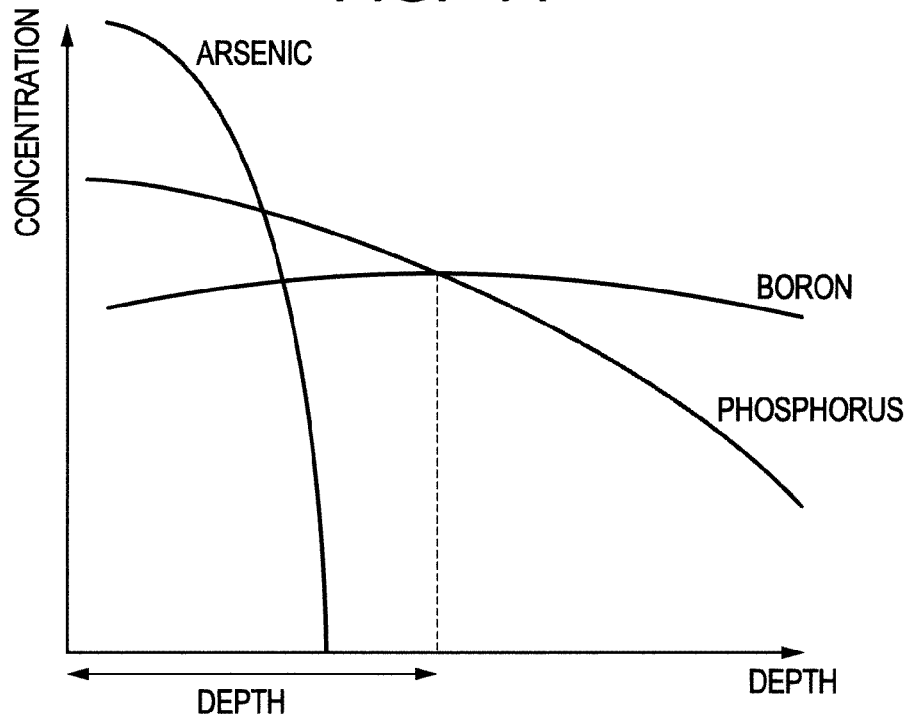
FIG. 14 is a graph showing the relationship between the depth of the n-type impurity region forming the n-type MOSFET transistor from the main surface of the semiconductor substrate, and an impurity concentration of the n-type impurity region.

The horizontal axis of the graph shown in FIG. 14 indicates the depth from the main surface on the upper side of the semiconductor substrate within the semiconductor substrate. That is, an origin point on the horizontal axis indicates the main surface on the upper side of the semiconductor substrate. The longitudinal axis of the graph indicates the concentration of atoms of phosphorus, arsenic, and boron in regions at respective depths.

Suppose that the n-type impurity region contains arsenic impurities as a principal component, and also phosphorus impurities. Specifically, as shown in FIG. 14, the n-type impurity region has a depth from the main surface of the semiconductor substrate to a point where the concentration of phosphorus is equal to that of the boron in the case of FIG. 14.

In this case, the depth of the n-type impurity region corresponds to a distance from the main surface of the semiconductor substrate to the point where the concentration of phosphorus is equal to that of the boron. The above point corresponds to a curve (lowermost part) indicative of a boundary (interface) between the impurity regions LNR and NR2, or between the impurity regions LPR and PR1 as shown in the cross-sectional views of FIGS. 10 to 13.

The n-type impurity region NR, and the interface between the respective regions included in the n-type impurity region NR have been described above by way of example. The p-type impurity region PR, and the interface between the respective regions included in the p-type impurity region PR can also be defined in the same way.

The following method is used as one example of a method for verifying the interface between the above impurity regions. The impurity regions are subjected to etching, for example, using a Sirtl etchant. At this time, the etching rate changes depending on the kinds of impurities contained in the impurity region, or according to the presence or absence of impurity materials. By analyzing the change in etching rate, the position of the interface between the impurity regions can be recognized. The above method is just one example, and thus the position or depth of the interface between the impurity regions may be verified using other methods.

Now, the operation and effects of the semiconductor device including the core transistor and the I/O transistor in this embodiment will be described below.

Figure 15:
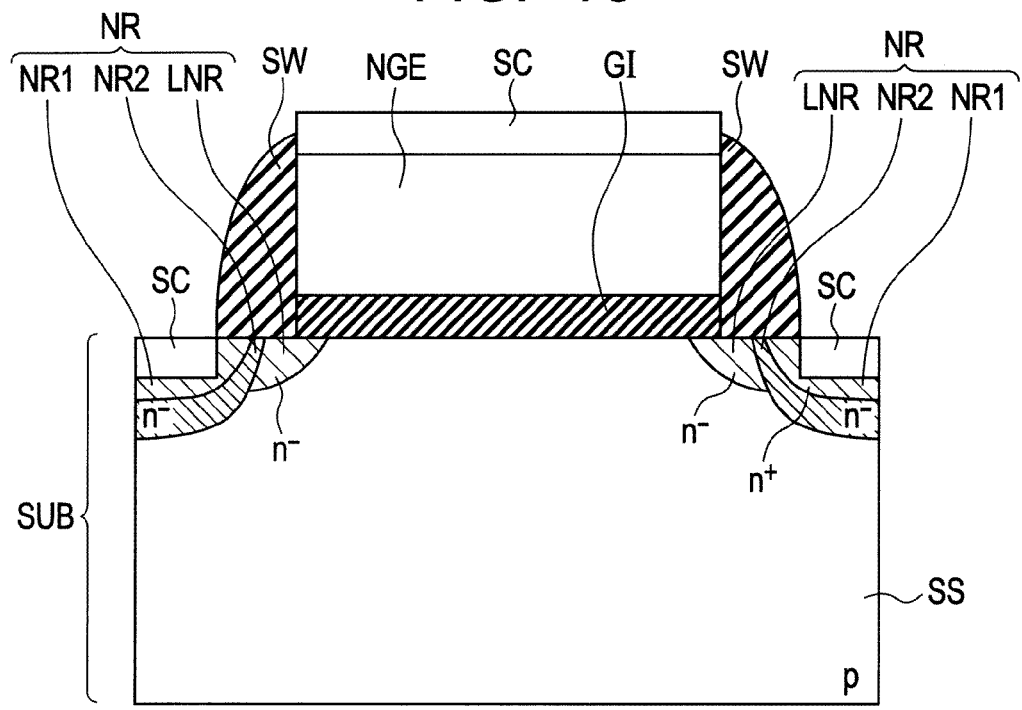
FIG. 15 is a schematic cross-sectional view showing the more detailed structure of an n-type impurity region in a related art I/O n-type MOS transistor, like FIG. 10.
Figure 16:
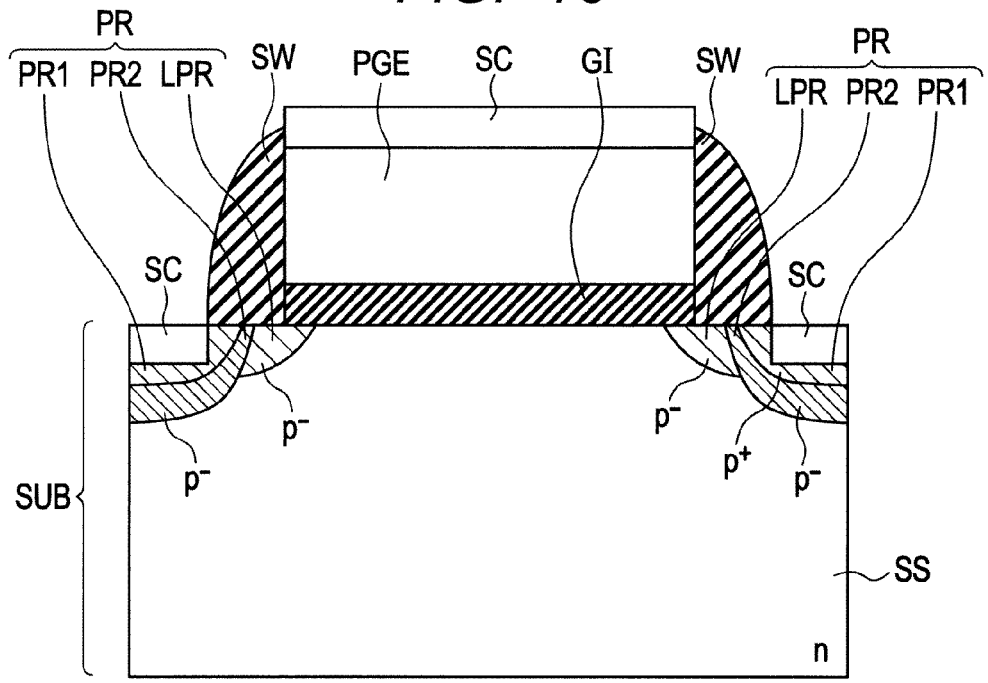
FIG. 16 is a schematic cross-sectional view showing the more detailed structure of a p-type impurity region in a related art I/O p-type MOS transistor, like FIG. 11.

Referring to FIGS. 15 and 16, differences between this embodiment and the related art examples will be described below. The n-type impurity region NR of the related art I/O n-type transistor has the same structure and depth as that of the n-type impurity region NR of the core n-type transistor of this embodiment. That is, FIG. 15 differs from FIG. 10 in that the low concentration n-type impurity region LNR is shallower than the n-type impurity region NR2, and that the entire n-type impurity region NR is shallower than that of the I/O n-type transistor of this embodiment. Also, in the related art I/O p-type transistor, FIG. 16 differs from FIG. 11 in that the low concentration p-type impurity region LPR is shallower than the p-type impurity region PR2, and that the entire p-type impurity region PR is shallower than that of the I/O p-type transistor of this embodiment.

Figure 17:
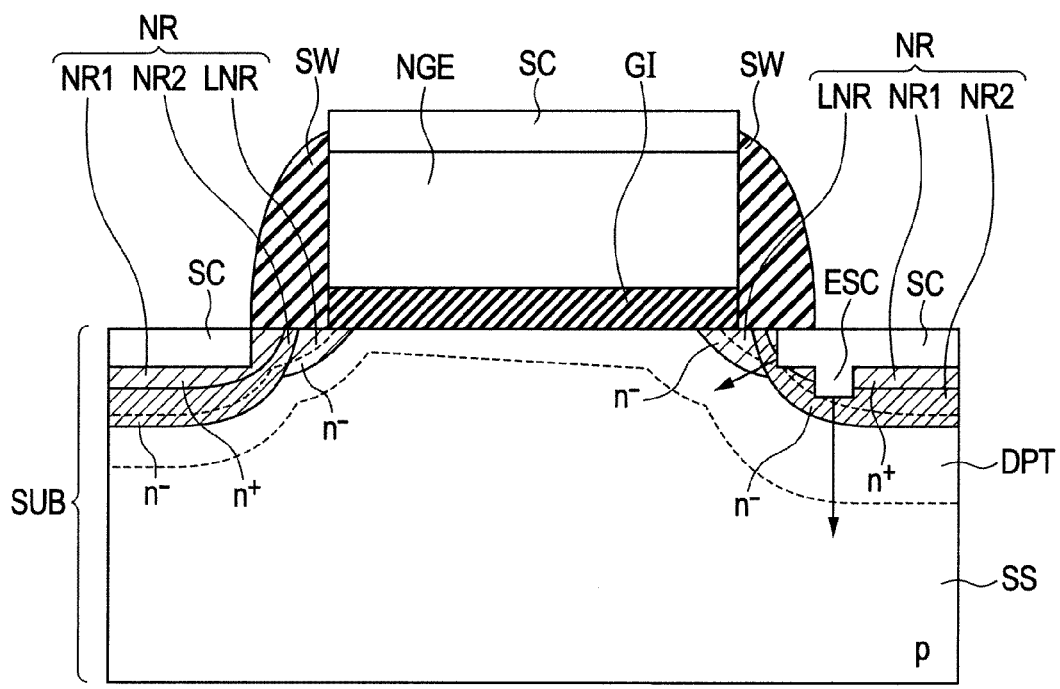
FIG. 17 is a schematic cross-sectional view showing the state of operation of the related art I/O n-type MOS transistor when the transistor is driven by applying a drain voltage thereto.

Referring to FIG. 17, a gate voltage is applied to the gate electrode NGE of the I/O n-type transistor shown in FIG. 15, and a drain voltage is applied to the n-type impurity region NR as a drain region. At this time, such voltages form a depletion layer DPT inside the semiconductor substrate SUB. The depletion layer DPT is a region sandwiched between a dotted curve extending from the source region (the left n-type impurity region NR) to the drain region (the right n-type impurity region NR) shown in FIG. 17, and a dotted curve drawn in the vicinity of the source region and the drain region.

As mentioned above, the drain voltage of the I/O transistor is very high (about 5 V) as compared to the drain voltage of the core transistor. Thus, the depletion layer DPT around the drain region of the I/O transistor has a large width intersecting in the direction of extension as compared to that of a depletion layer around the drain region of the core transistor.

The silicide SC of the drain region (n-type impurity region NR) is not necessarily flat over the entire main surface of the semiconductor substrate SUB. The silicide SC may actually have a silicide convex portion ESC partly formed therein to protrude into the semiconductor substrate SUB in some cases. The same goes for the depletion layer. The depletion layer may partly has a region with large concavities and convexities.

Application of the high drain voltage results in increased width of the depletion layer DPT, which brings the silicide convex portion ESC (silicide SC) into contact with the depletion layer DPT.

As a result, the leak current can be generated by the arrow shown in FIG. 17. Even when a distance between the depletion layer DPT and the silicide SC (silicide convex portion ESC) of the I/O transistor is the same as that of the core transistor, the I/O transistor tends to cause the leak current as compared to the core transistor. This is because the drain voltage of the I/O transistor is higher than the drain voltage of the core transistor.

In this embodiment, the n-type (p-type) impurity region of the I/O transistor is formed more deeply than the n-type (p-type) impurity region of the core transistor. In this way, the depletion layer DPT under the n-type impurity region as the drain region is formed in a much deeper position. Even when a number of silicide convex portions ESC are contained in the silicide SC or the silicide SC is formed in a relatively deep position, the distance between the silicide SC (silicide convex portion ESC) and the depletion layer DPT can be increased. Thus, even if the high drain voltage is applied to the transistor, the silicide SC (silicide convex portion ESC) can be prevented from coming into contact with the depletion layer DPT. That is, this arrangement can suppress the generation of the leak current to improve the reliability of each circuit included in the semiconductor device DV.

Generally, the deeper the n-type (p-type) impurity region, the larger the width of the impurity region in the lateral direction shown in FIG. 17. Thus, when the impurity region is formed deeply, the distance from the silicide SC to the depletion layer DPT can be increased not only in the depth direction, but also in the width direction, which can suppress the generation of the leak current between the silicide SC and the depletion layer DPT.

Figure 18:
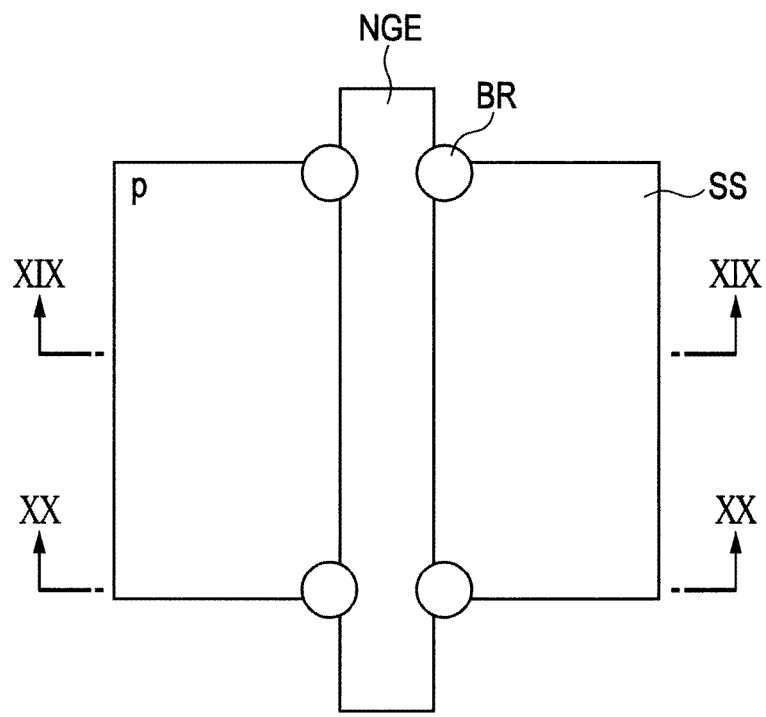
FIG. 18 is a schematic top view for explaining a part of the I/O n-type MOS transistor in which segregation occurs.

FIG. 18 shows only the support substrate SS and the n-type gate electrode NGE, while omitting other components. Referring to the top view of FIG. 18, especially, the I/O n-type transistor causes the segregation of boron impurities contained in the p-type support substrate SS mainly at the interface between the oxide film and the silicon. The segregation is a phenomenon in which impurity atoms accumulate at a specific point.

The above-mentioned segregation of impurity atoms is noticeable especially at the support substrate SS containing boron. This is based on the following reason. The impurity atoms of boron easily move because of a small atomic weight of boron. Thus, the atoms of boron are likely to be diffused as compared to other impurity atoms.

The segregation tends to be caused, in addition to the vicinity of the interface between the field oxide film FO and the support substrate SS, in the vicinity of an interface between the oxide film and a silicon single crystal, and in the vicinity of an interface between the oxide film and the n-type impurity region NR.

Figure 19:
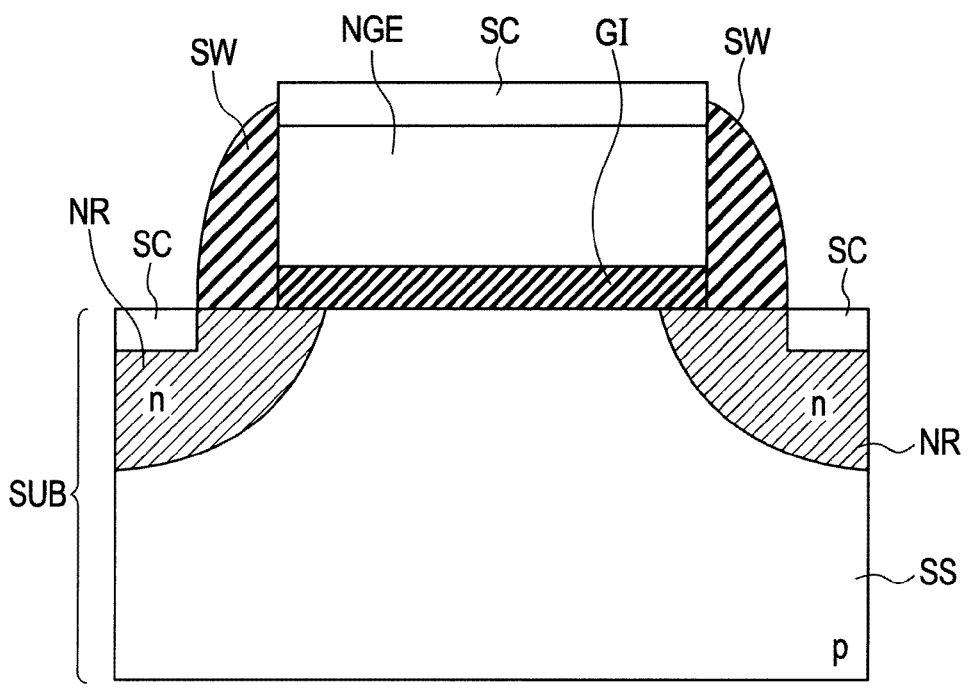
FIG. 19 is a schematic cross-sectional view of the part taken along the line XIX-XIX of FIG. 18.
Figure 20:
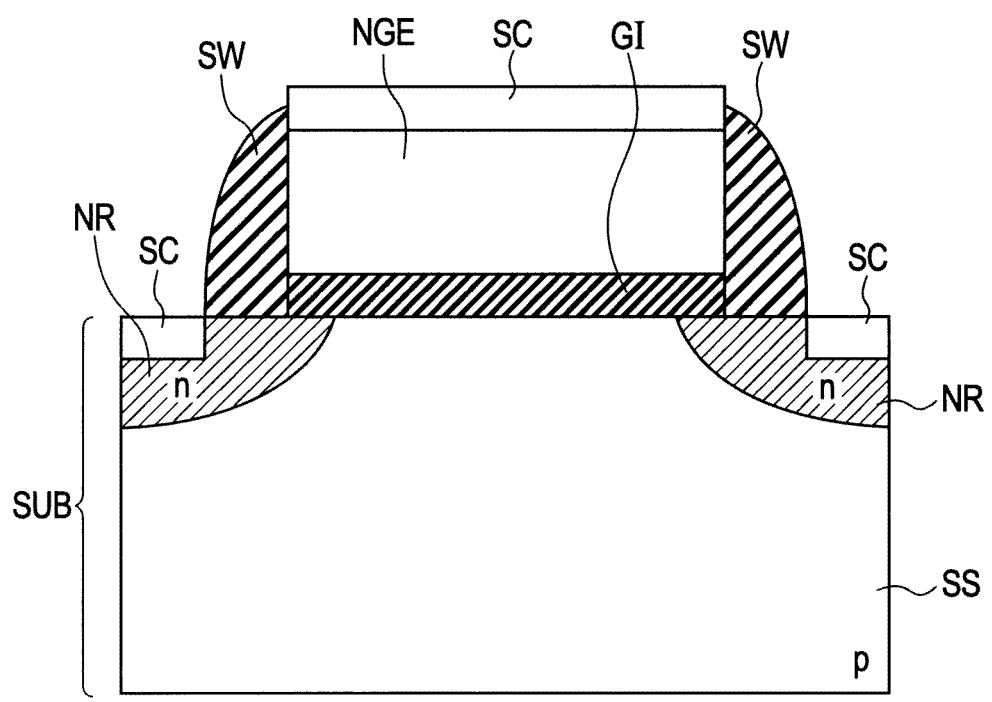
FIG. 20 is a schematic cross-sectional view of the part taken along the line XX-XX of FIG. 18.

Referring to FIGS. 18, 19, and 20, the lowermost part of the n-type impurity region NR becomes shallow in the region where the segregation is caused (see FIG. 20), as compared to the region where no segregation is caused (see FIG. 19) during driving of the I/O n-type transistor. This is because the impurity atoms contained in the p-type substrate SS, such as boron, are recombined with the impurities of the n-type impurity region NR to extinguish the impurities under the n-type impurity region NR, resulting in the depletion layer.

That is, when the segregation occurs in the vicinity of the channel or drain region, the n-type impurity region NR becomes shallow, so that the depletion layer is formed in the shallow region under the drain region. Then, the distance between the silicide in the drain region and the depletion layer under the drain region becomes short, which tends to generate the leak current therebetween.

As mentioned above, in the I/O n-type transistor, especially, including the p-type support substrate SS doped with the boron impurities, the leak current tends to be generated due to the application of the high voltage to the drain region. For this reason, in this embodiment, the n-type impurity region NR in the I/O n-type transistor is formed more deeply than that in the I/O p-type transistor. This arrangement suppresses the generation of the leak current due to the application of the high voltage to the drain voltage during driving of the I/O n-type transistor. Thus, the semiconductor device DV has improved reliability of each circuit included therein.

Next, a manufacturing method of the semiconductor device DV in this embodiment will be described below. The semiconductor device DV includes four types of transistors in total, namely, the core n-type transistor, the core p-type transistor, the I/O n-type transistor, and the I/O p-type transistor. The manufacturing method of the structure including one core n-type transistor and one I/O n-type transistor arranged in parallel side by side as shown in FIGS. 2 and 3 will be described below with reference to the following FIGS. 21 to 31.

Figure 21:
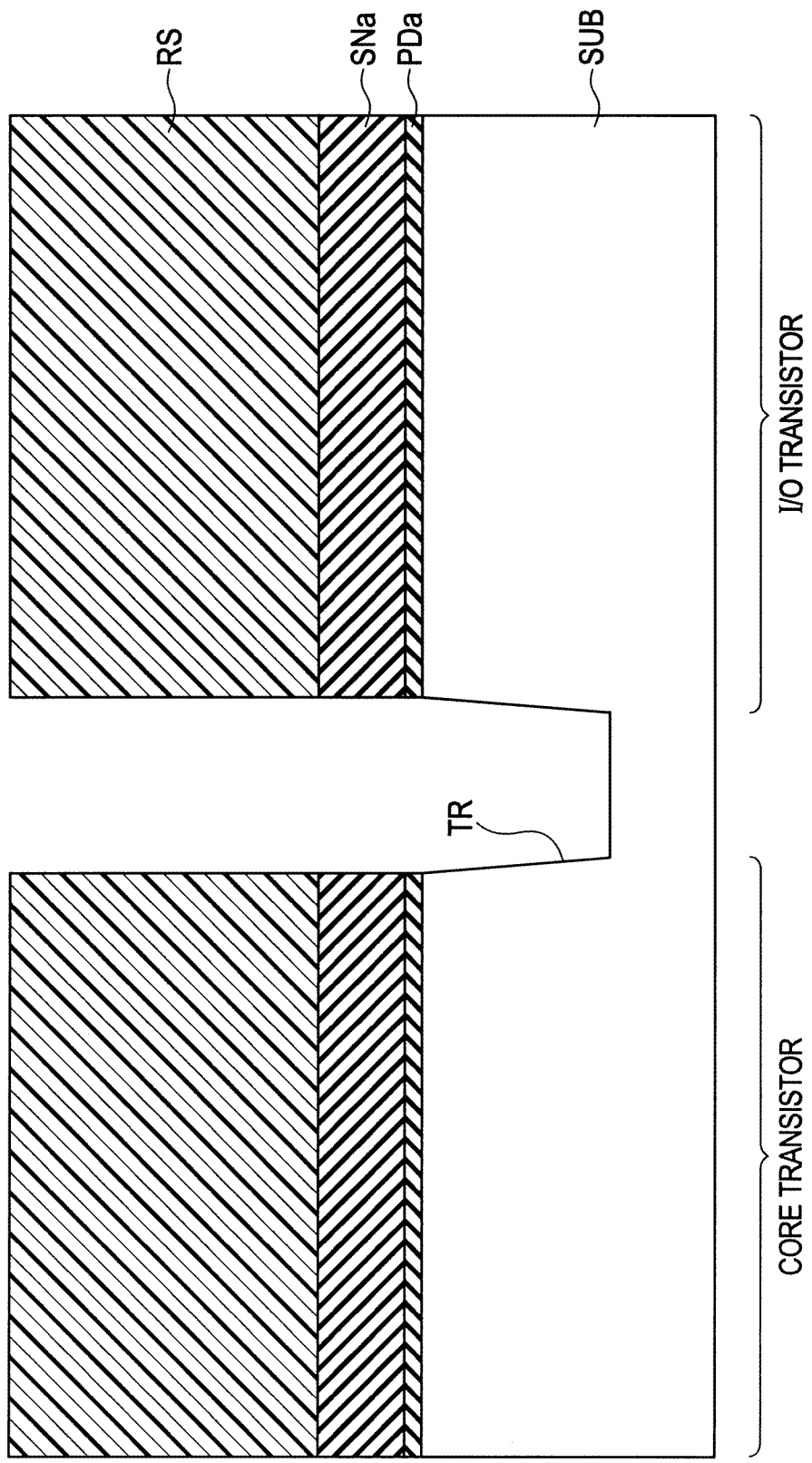
FIG. 21 is a schematic cross-sectional view showing a first step of a manufacturing method of the semiconductor device in the first embodiment of the invention.

First, referring to FIG. 21, a semiconductor substrate SUB is prepared. The semiconductor substrate SUB is preferably formed using, for example, an n-type support substrate made of silicon single crystal. Preferably, a pad oxide film PDa and a silicon nitride film SNa are formed in that order over one (upper) main surface of the semiconductor substrate SUB, for example, by a chemical vapor deposition (CVD) method.

The pad oxide film PDa is preferably comprised of, for example, a silicon oxide film. The pad oxide film PDa preferably has a thickness of not less than 5 nm nor more than 20 nm. The silicon nitride film SNa is preferably comprised of, for example, silicon nitride (SiN). The silicon nitride film SNa preferably has a thickness of about 100 nm, for example, not less than 70 nm nor more than 150 nm.

Then, trenches TR are formed by a normal photoengraving process using a general photoresist RS. The trench TR is a groove formed by removing parts of the silicon nitride film SNa, the pad oxide film PDa, and the semiconductor substrate SUB through etching. Each trench TR is provided to form a region for isolating a plurality of semiconductor elements (for example, core transistor and I/O transistor) from each other. The trench is preferably formed by etching the semiconductor substrate SUB at a depth of not less than 200 nm nor more than 300 nm from the upper main surface of the substrate SUB.

Figure 22:
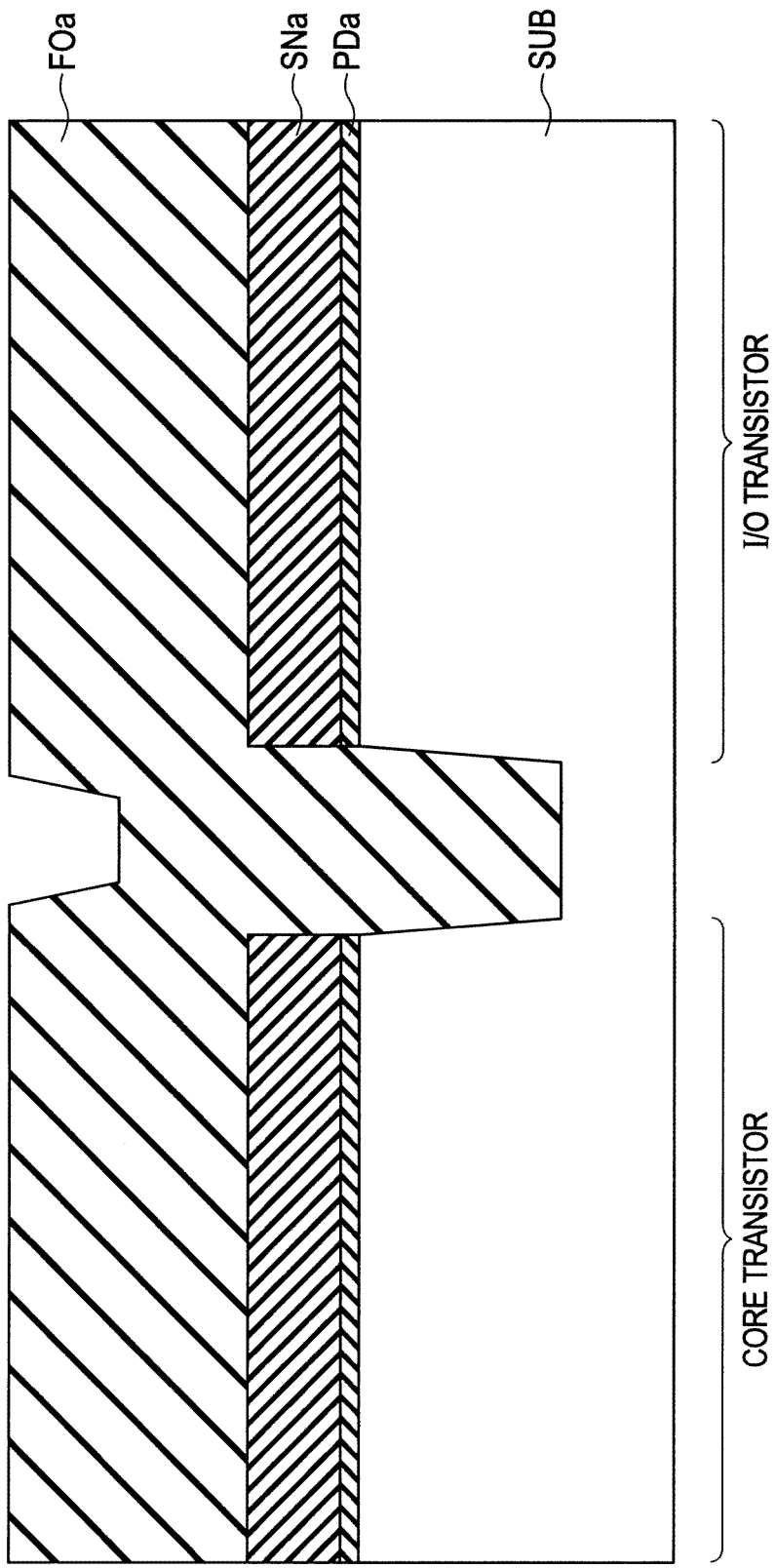
FIG. 22 is a schematic cross-sectional view showing a second step of the manufacturing method of the semiconductor device in the first embodiment of the invention.

Referring to FIG. 22, then, a silicon oxide film FOa is deposited over the bottom of the trench TR and the silicon nitride film SNa, for example, by the CVD method. The silicon oxide film FOa has a thickness of about 500 nm, and preferably of not less than 400 nm nor more than 600 nm.

Figure 23:
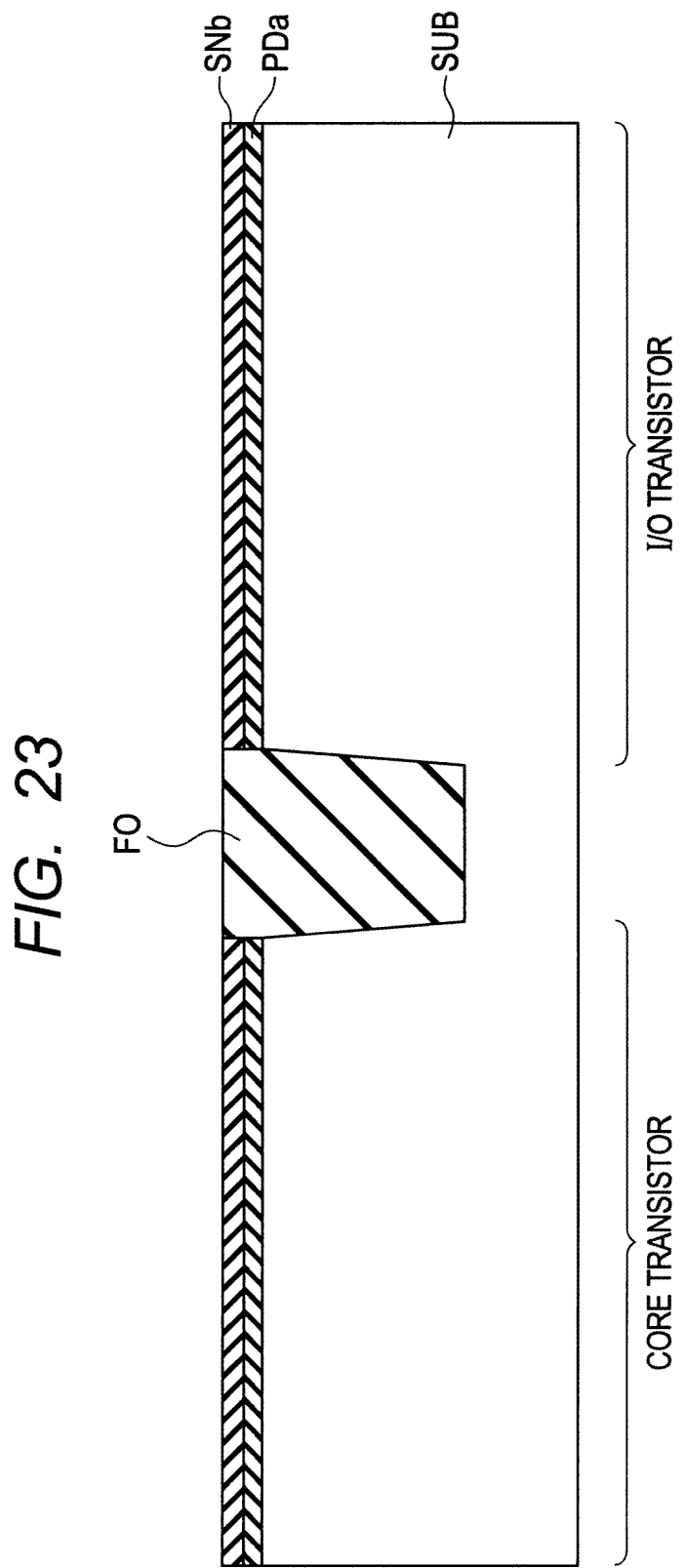
FIG. 23 is a schematic cross-sectional view showing a third step of the manufacturing method of the semiconductor device in the first embodiment of the invention.

Referring to FIG. 23, the surface (upper part) of the silicon oxide film FOa is subjected to the chemical mechanical polishing (CMP). At this time, the silicon oxide film FOa and the silicon nitride film SNa thereunder are polished. The silicon nitride film after the polishing becomes a silicon nitride film SNb. Only the silicon oxide film FOa formed in the trench TR remains without being polished to become a field oxide film FO for electrically isolating the adjacent transistors from each other.

Figure 24:
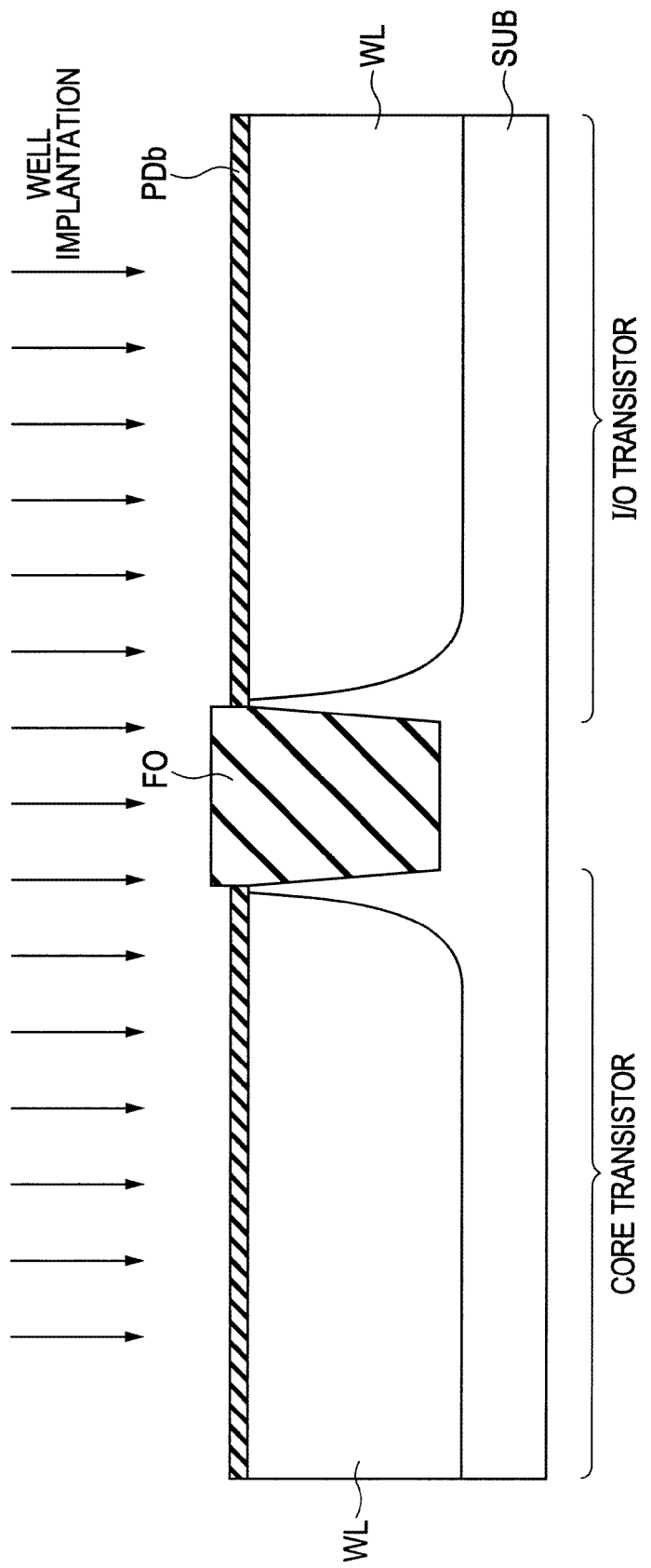
FIG. 24 is a schematic cross-sectional view showing a fourth step of the manufacturing method of the semiconductor device in the first embodiment of the invention.

Referring to FIG. 24, first, the silicon nitride film SNb is removed, for example, by wet etching. Then, patterning is performed using the photoengraving process. Specifically, a resist film having an opening in a region where a well WL is to be formed is formed. Using the resist film as a mask, p-type impurities, such as boron, are applied substantially in the vertical direction with respect to the main surface of the semiconductor substrate SUB. The impurities are implanted into the semiconductor substrate SUB (well implantation) to form a p-type well WL containing boron.

In the well implantation shown in FIG. 24, the energy of the boron atoms implanted is preferably as follows. In the first stage, boron atoms are implanted by applying an energy of several hundreds of keV, for example, not less than 100 keV nor more than 500 keV. At this time, boron atoms are preferably implanted, for example, in an application density of not less than $1\times10^{12}$ cm$^{-2}$ nor more than $5\times10^{13}$ cm$^{-2}$ in a planar view. Then, in the second stage, boron atoms are implanted by applying an energy of several tens of keV, for example, not less than 10 keV nor more than 50 keV. At this time, boron atoms are preferably implanted, for example, in an application density of not less than $1\times10^{11}$ cm$^{-2}$ nor more than $5\times10^{12}$ cm$^{-2}$ in a planar view.

The thus-formed p-type well WL is used as a p-type base region required for producing, for example, an n-type MOSFET using an n-type semiconductor substrate SUB. FIGS. 25 to 31 will omit the illustration of the well WL, provided the entire semiconductor substrate SUB is the p-type base region.

Figure 25:
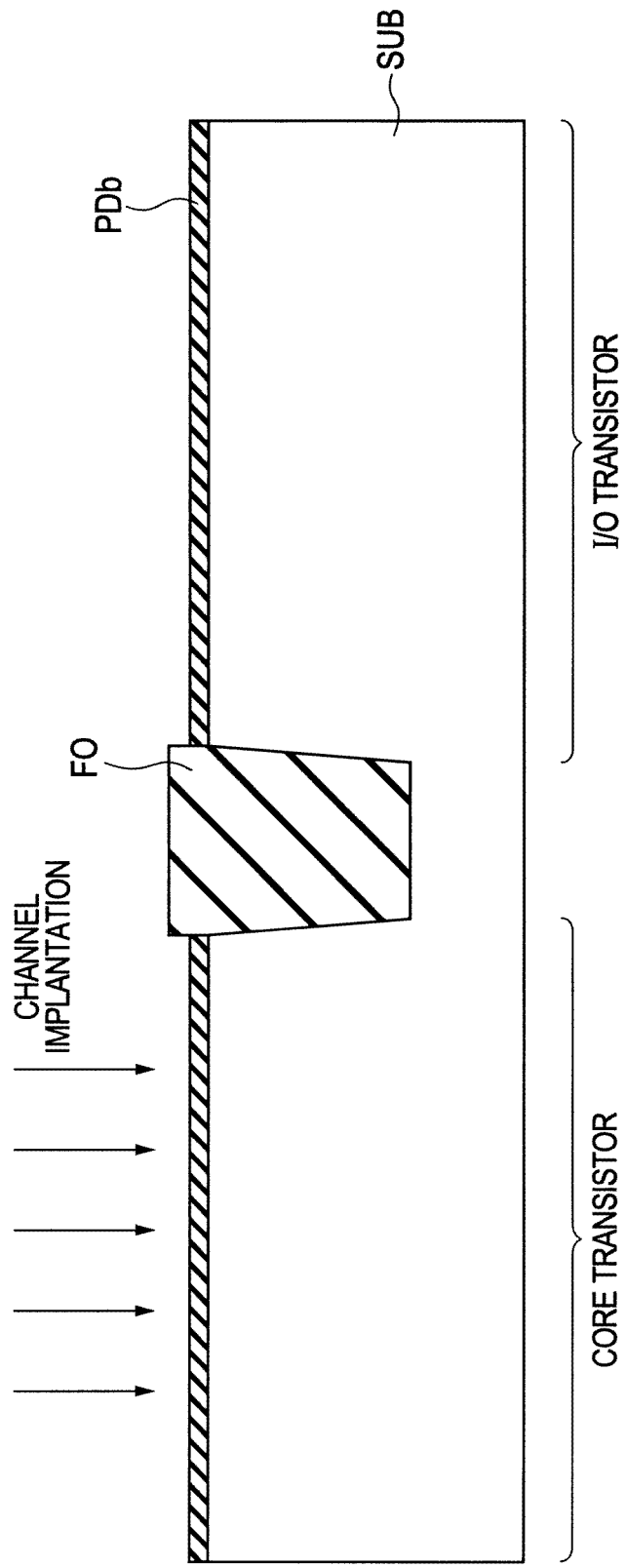
FIG. 25 is a schematic cross-sectional view showing a fifth step of the manufacturing method of the semiconductor device in the first embodiment of the invention.

Referring to FIG. 25, ion implantation is additionally performed only on a region where the core transistor is to be formed. Specifically, for example, p-type impurities, such as boron, are implanted into a desired region of the semiconductor substrate SUB in the same way as the well implantation shown in FIG. 24 (channel implantation). At this time, the energy of boron atoms implanted is preferably as follows. Boron atoms are implanted by applying an energy of a dozen or so keV, for example, not less than 10 keV nor more than 20 keV. At this time, boron atoms are preferably implanted, for example, in an application density of not less than $1\times10^{12}$ cm$^{-2}$ nor more than $5\times10^{13}$ cm$^{-2}$ in a planar view.

Figure 26:
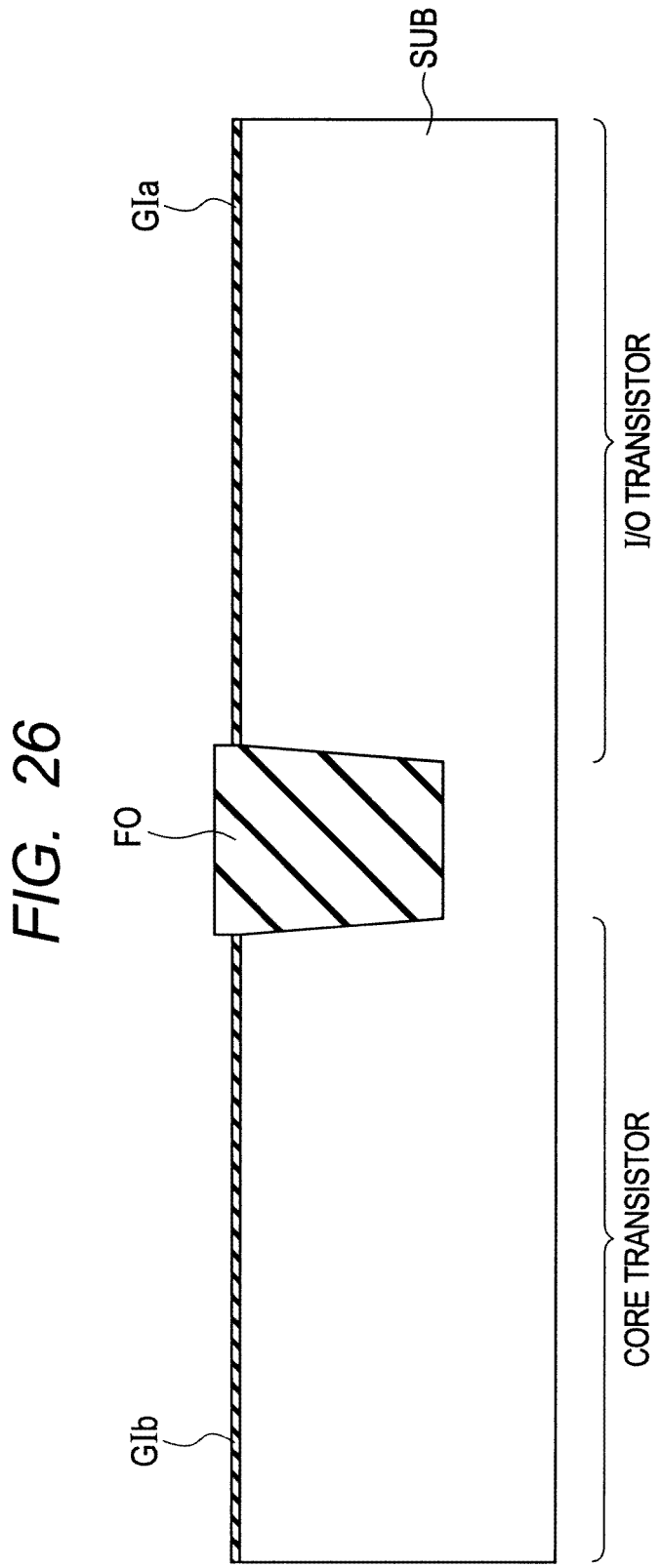
FIG. 26 is a schematic cross-sectional view showing a sixth step of the manufacturing method of the semiconductor device in the first embodiment of the invention.

Referring to FIG. 26, the pad oxide film PDb is first removed, for example, by wet etching. Then, a gate insulating film GIa is deposited over the entire main surface of the semiconductor substrate SUB, for example, using a thermal oxidation method. The gate insulating film GIa is preferably deposited in a thickness of several tens of nm, for example, not less than 5 nm nor more than 20 nm. The gate insulating film GIa is preferably comprised of, for example, a silicon oxide film. After forming the gate insulating film GIa, a part of the gate insulating film GIa in the region where the core transistor is to be formed is removed by the wet etching, so that a gate insulating film GIb thinner than the gate insulating film GIa is formed. The gate insulating film GIb is preferably formed in a thickness of several nm, for example, not less than 1 nm nor more than 3 nm.

Figure 27:
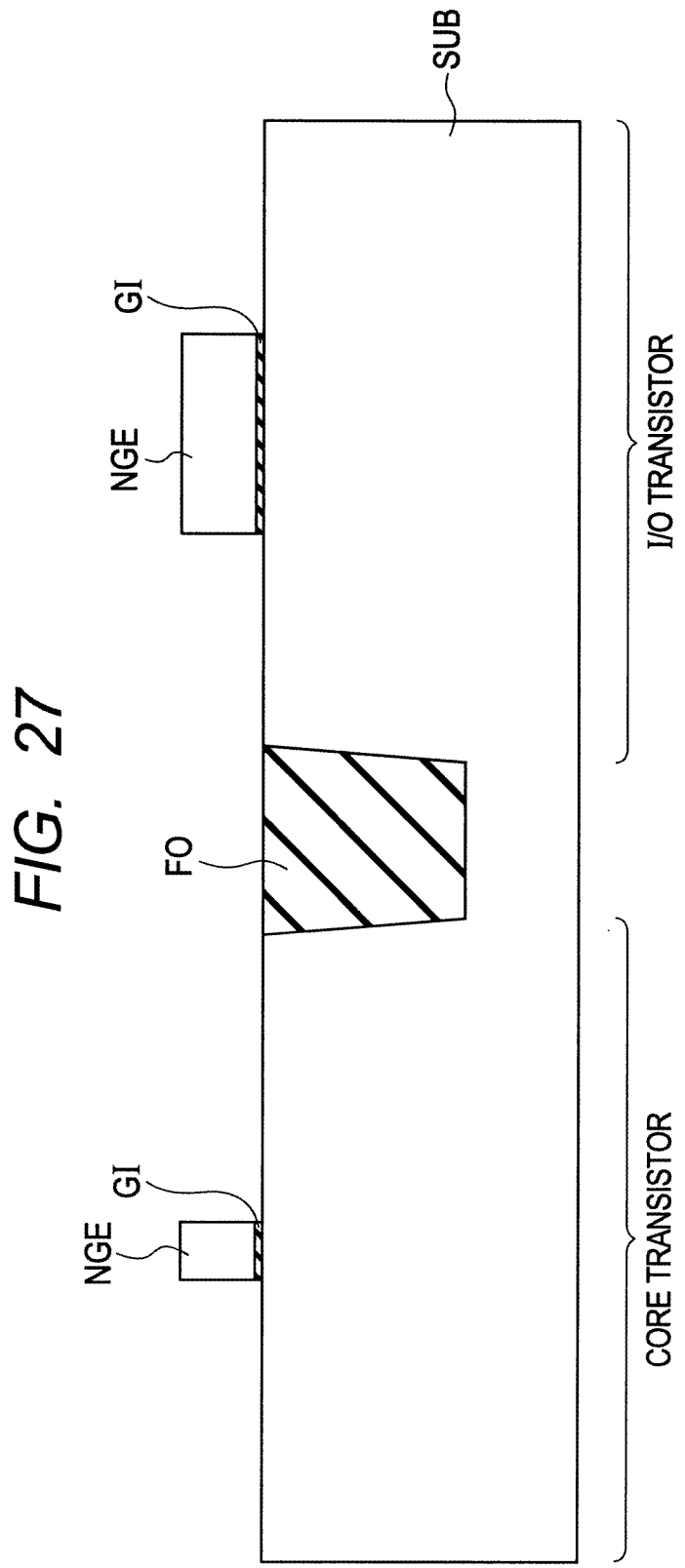
FIG. 27 is a schematic cross-sectional view showing a seventh step of the manufacturing method of the semiconductor device in the first embodiment of the invention.

Referring to FIG. 27, a polycrystal silicon is deposited over the gate insulating films GIa and GIb, for example, by the CVD method. The polycrystal silicon deposited has a thickness of, for example, not less than 20 nm nor more than 300 nm. Next, impurities are implanted into the polycrystal silicon. At this time, for example, phosphorus atoms as the n-type impurity are implanted into the polycrystal silicon in the same way as the implantation processes shown in FIGS. 24 and 25. At this time, the phosphorus atoms are preferably implanted, for example, in an application density of not less than $1\times10^{15}$ cm$^{-2}$ nor more than $5\times10^{15}$ cm$^{-2}$ in a planar view by applying an energy of, for example, not less than 1 keV nor more than 50 keV.

Thereafter, the polycrystal silicon, and the gate insulating films GIa and GIb thereunder which are deposited are patterned so as to form the n-type gate electrode NGE and the gate insulating film GI in a desired shape. The patterning is performed, for example, by using the normal photoengraving process.

Figure 28:
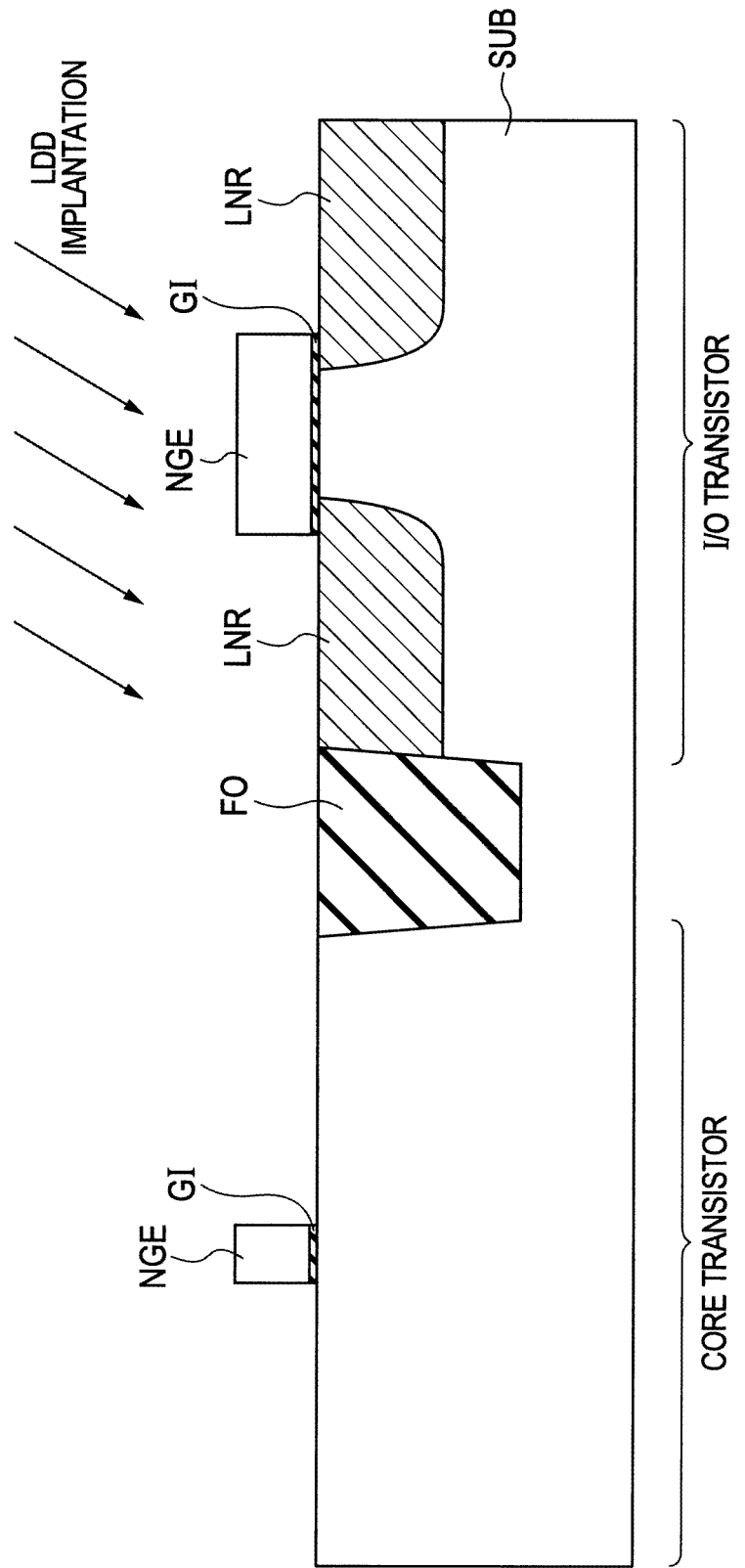
FIG. 28 is a schematic cross-sectional view showing an eighth step of the manufacturing method of the semiconductor device in the first embodiment of the invention.

Referring to FIG. 28, low concentration n-type impurity regions LNR are formed as the source and drain regions of the I/O transistor. The low concentration n-type impurity region LNR is formed in the same way as the implantation processes shown in FIGS. 24 and 25. At this time, the region containing phosphorus atoms as the n-type impurity is preferably formed, for example, in an application density of not less than $1\times10^{13}$ cm$^{-2}$ nor more than $1\times10^{14}$ cm$^{-2}$ in a planar view by applying an energy of, for example, not less than 1 keV nor more than 120 keV.

In the step shown in FIG. 28, phosphorus atoms are preferably implanted (LDD implantation) into the main surface of the semiconductor substrate SUB in the oblique direction with respect to the direction vertical to the main surface of the substrate. Specifically, phosphorus atoms are preferably implanted into the main surface of the semiconductor substrate SUB at the angle of not less than 0° nor more than 60° with respect to the direction vertical to the main surface of the substrate.

The low concentration n-type impurity region LNR is formed as a deep junction of the source region or drain region of the I/O transistor. Thus, the impurities are implanted into the main surface of the semiconductor substrate SUB in the oblique direction with respect to the direction vertical to the main surface of the substrate. As a result, the impurity atoms can be implanted into a deep region under the n-type gate electrode NGE.

A method of selectively implanting the impurities only into the region where the low concentration n-type impurity region LNR is to be formed is preferably performed by forming a mask layer patterned by the photoengraving process in the same way as the implantation processes shown in FIGS. 24 and 25.

Figure 29:
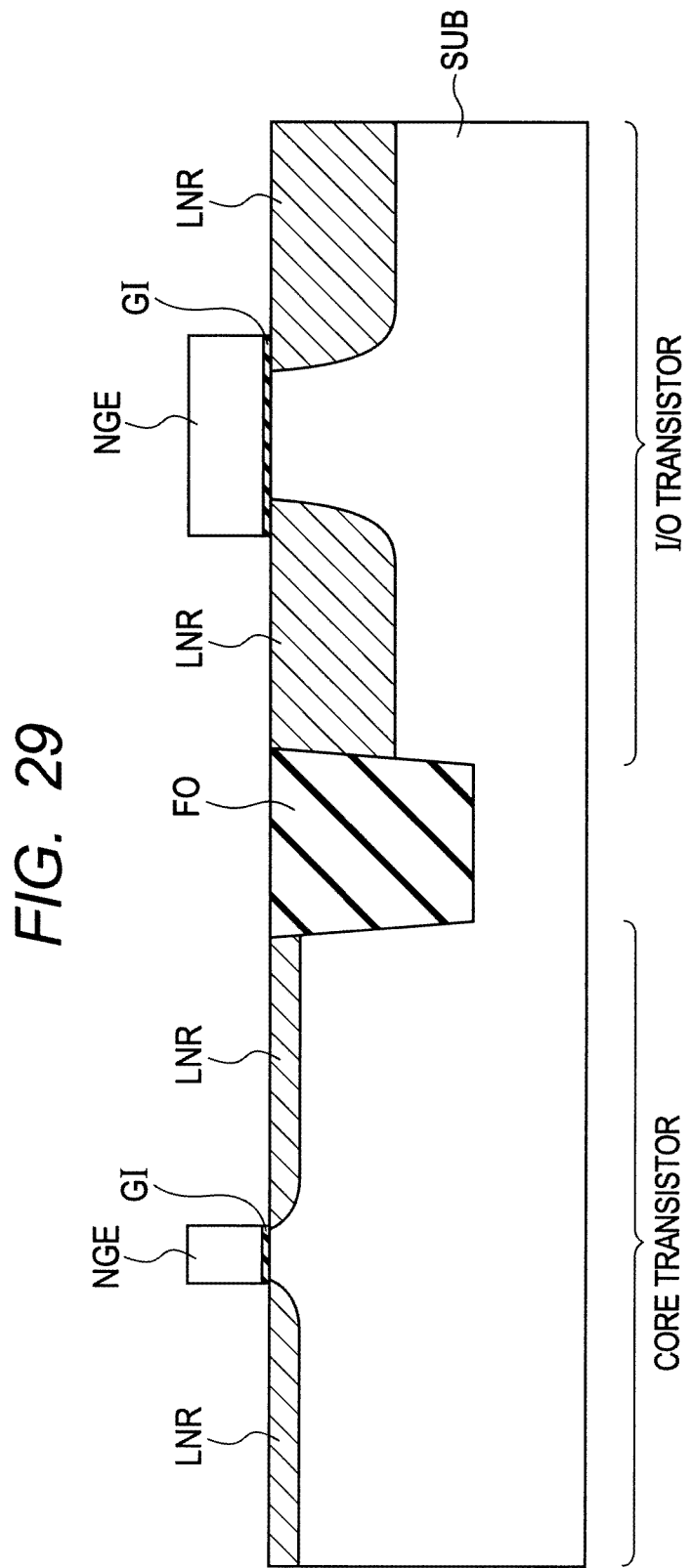
FIG. 29 is a schematic cross-sectional view showing a ninth step of the manufacturing method of the semiconductor device in the first embodiment of the invention.

Referring to FIG. 29, the low concentration n-type impurity regions LNR are formed as the source and drain regions of the core transistor. The low concentration n-type impurity region LNR is formed, for example, by implanting the arsenic atoms as the n-type impurity in the same way as the implantation processes shown in FIGS. 24 and 25. At this time, phosphorus atoms are preferably implanted, for example, in an application density of not less than $5 \times 10^{13}$ cm$^{-2}$ nor more than $1 \times 10^{15}$ cm$^{-2}$ in a planar view by applying an energy of, for example, not less than 1 keV nor more than 20 keV.

Figure 30:
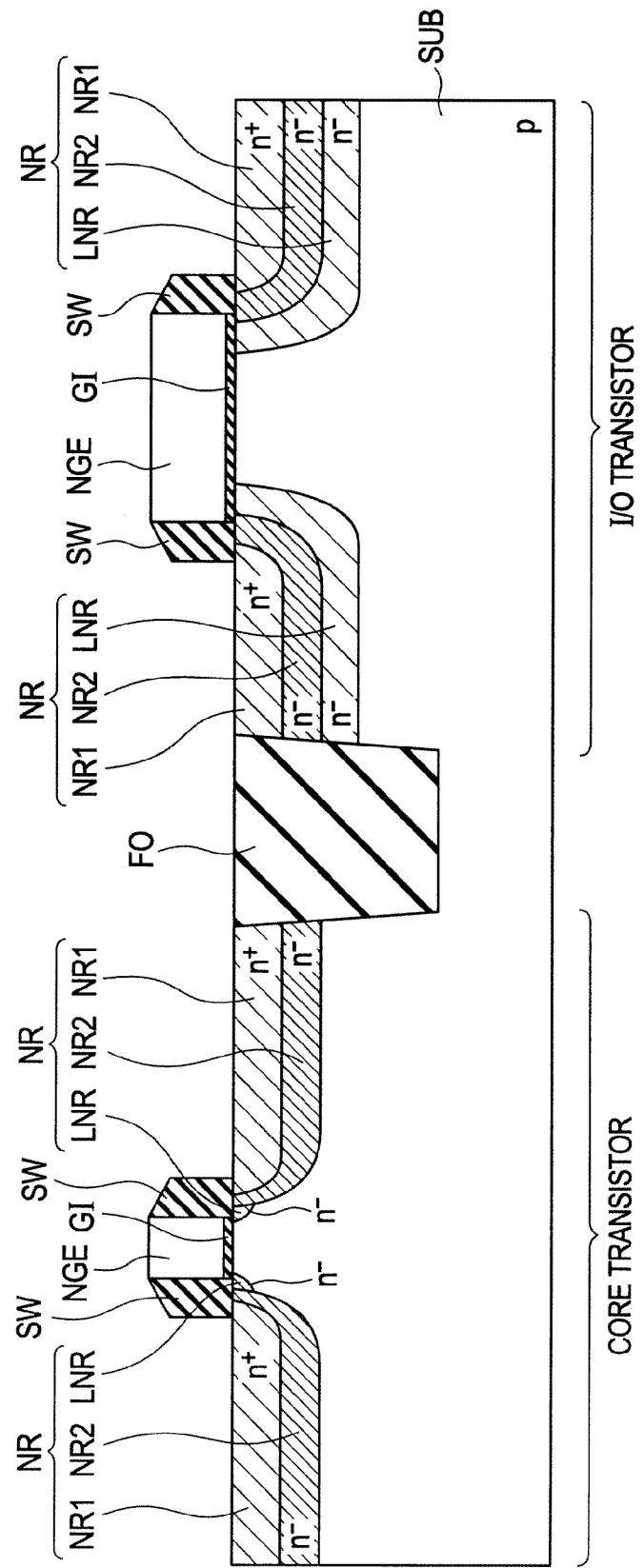
FIG. 30 is a schematic cross-sectional view showing a tenth step of the manufacturing method of the semiconductor device in the first embodiment of the invention.

Referring to FIG. 30, sidewall insulating films SW are formed over sides of the n-type gate electrode NGE and the gate insulating film GI in each of the core transistor and the I/O transistor. Specifically, a silicon oxide film is deposited, for example, by the CVD method to cover the main surface of the semiconductor substrate SUB, and the upper surface and sides of the n-type gate electrode NGE in each of the core transistor and the I/O transistor. Thereafter, the dry etching is performed to form the sidewall insulating films SW.

Then, the n-type impurity regions NR1 and NR2 are formed as the source/drain region of each of the core transistor and the I/O transistor by implantation of impurities in the same way as the above respective steps. Specifically, for example, arsenic atoms are implanted to form the n-type impurity region NR1, and phosphorus atoms are implanted to form the n-type impurity region NR2.

The arsenic atoms are preferably implanted, for example, in an application density of not less than $3 \times 10^{14}$ cm$^{-2}$ nor more than $3 \times 10^{15}$ cm$^{-2}$ in a planar view by applying an energy of, for example, not less than 1 keV nor more than 50 keV. The phosphorus atoms are preferably implanted, for example, in an application density of not less than $5 \times 10^{12}$ cm$^{-2}$ nor more than $1 \times 10^{14}$ cm$^{-2}$ in a planar view by applying an energy of, for example, not less than 1 keV nor more than 50 keV. The angle at which each impurity is implanted is preferably in the direction substantially vertical to the main surface of the semiconductor substrate SUB.

As mentioned above, the n-type impurity region NR is formed of the n-type impurity regions NR1 and NR2 and the low concentration impurity region LNR. The entire n-type impurity region NR in the I/O n-type transistor is preferably formed more deeply in the depth direction from the main surface of the semiconductor substrate SUB than that in the core n-type transistor. The depth of the low concentration n-type impurity region LNR of the I/O transistor formed in FIG. 28 is the depth of the entire n-type impurity region NR of the I/O transistor.

More specifically, the n-type impurity region NR is preferably formed such that the depth of the entire n-type impurity region NR of the I/O transistor is 1.4 or more times larger than that of the entire n-type impurity region NR of the core transistor.

After forming the n-type impurity region NR as the source/drain region as mentioned above, the semiconductor substrate SUB is subjected to the so-called annealing process, specifically, heated at a temperature of about 1000° C., for example, of not less than 900° C. nor more than 1100° C., in several tens of seconds. This process activates the impurity atoms, such as arsenic or phosphorus, inside the n-type impurity region NR.

Figure 31:
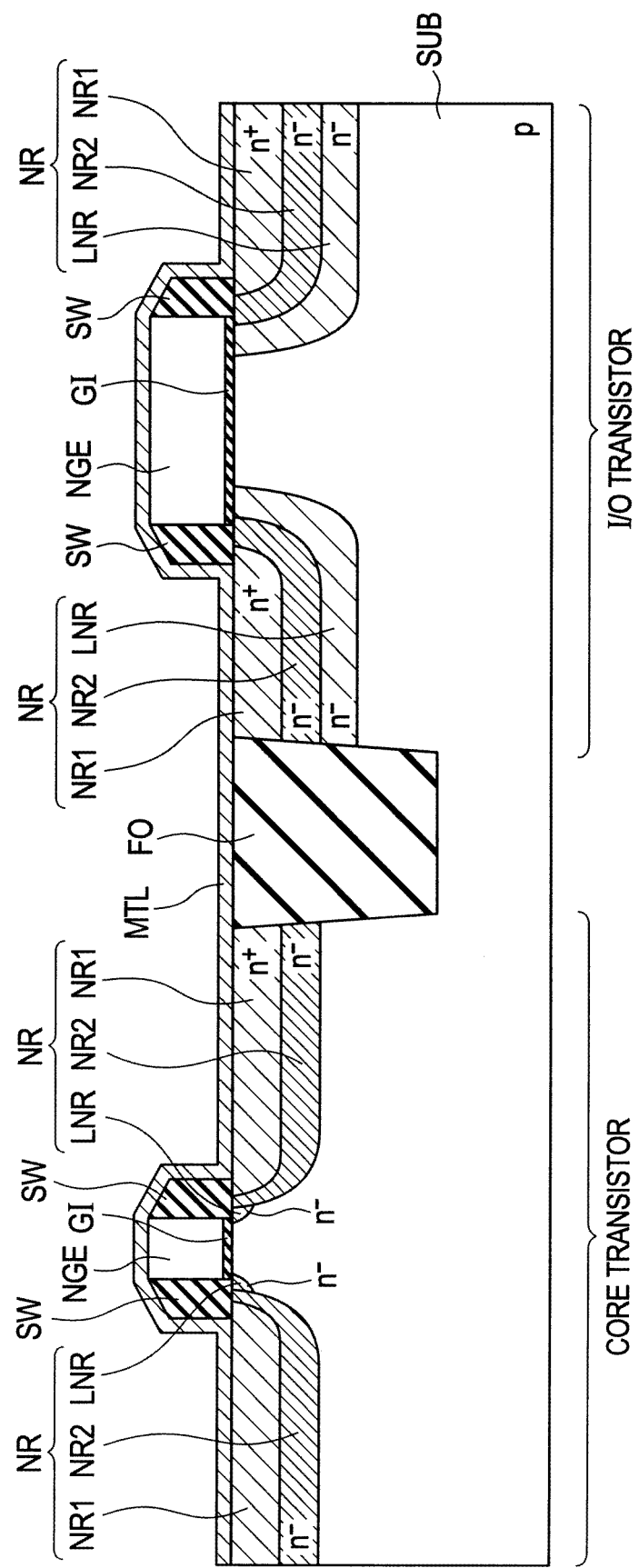
FIG. 31 is a schematic cross-sectional view showing an eleventh step of the manufacturing method of the semiconductor device in the first embodiment of the invention.

Then, referring to FIG. 31, a metal film MTL is deposited to cover the upper surfaces of the semiconductor substrate SUB, the n-type impurity region NR, and the n-type gate electrode NGE, and the sides of the n-type gate electrode NGE and the gate insulating film GI. The metal film MTL is formed by depositing a lamination of, for example, cobalt and titanium nitride (TiN), only in a thickness of not less than several nm nor more than several tens of nm in total. Instead of the lamination of the above cobalt and titanium nitride, for example, a lamination of nickel and titanium nitride may be formed. The lamination of such a metal film MTL is preferably formed by general metal thin film formation methods, for example, sputtering or the like.

Then, the semiconductor substrate SUB is heated at a temperature of several hundreds of degrees (° C.) for several tens of seconds to several minutes, that is, subjected to the so-called annealing process. Then, the silicon atoms contained in the n-type impurity region NR and the n-type gate electrode NGE react with atoms of cobalt or nickel formed thereon to form the silicide SC (see FIG. 3). That is, the silicide SC is formed in the region in the vicinity of the main surface of the semiconductor substrate SUB and in the region in the vicinity of the uppermost surface of the n-type gate electrode NGE among the n-type impurity regions NR (silicidation).

Thereafter, the metal film MTL not silicided is removed, for example, by wet etching or the like. In the above steps, the semiconductor device including the core transistor and the I/O transistor is formed as shown in FIG. 3.

In the above description, the manufacturing method of only the core n-type transistor and the I/O n-type transistor have been given. However, the core p-type transistor and the I/O p-type transistor are also formed by the same manufacturing method. Differences in manufacturing method between the p-type transistor and the n-type transistor will be described below using FIGS. 21 to 31.

Specifically, when forming the p-type transistor, for example, a p-type support substrate SS is used as shown in FIG. 21. Referring to FIG. 24, phosphorus atoms and arsenic atoms which are n-type impurity atoms are implanted into wells. The energy of the impurity atoms implanted is preferably as follows. In the first stage, the phosphorus atoms are implanted by applying an energy of several hundreds of keV, for example, not less than 100 keV nor more than 500 keV. The phosphorus atoms at this time are preferably implanted, for example, in an application density of not less than $1 \times 10^{11}$ cm$^{-2}$ nor more than $5 \times 10^{13}$ cm$^{-2}$ in a planar view. Then, in the second stage, the arsenic atoms are implanted by applying an energy of several tens of keV, for example, not less than 10 keV nor more than 50 keV. At this time, the arsenic atoms are preferably implanted, for example, in an application density of not less than $1 \times 10^{11}$ cm$^{-2}$ nor more than $5 \times 10^{12}$ cm$^{-2}$ in a planar view.

Referring to FIG. 25, n-type impurities, such as arsenic, are implanted into a desired region of the semiconductor substrate SUB in the same way as the well implantation shown in FIG. 24 (channel implantation). The energy of the arsenic atoms implanted at this time is preferably as follows. The arsenic atoms are implanted by applying an energy of several tens of keV, for example, not less than 10 keV nor more than 50 keV. The arsenic atoms at this time are preferably implanted, for example, in an application density of not less than $1 \times 10^{12}$ cm$^{-2}$ nor more than $5 \times 10^{13}$ cm$^{-2}$ in a planar view.

Referring to FIG. 27, boron atoms are implanted as the p-type impurity into the polycrystal silicon. The strength of energy at this time is preferably, for example, not less than 1 keV nor more than 10 keV. The range of application or implantation of the boron atoms is the same as that of implantation of the phosphorus atoms as the n-type impurity into the polycrystal silicon.

In order to form the low concentration p-type impurity region LPR in the I/O region, referring to FIG. 28, for example, boron atoms are implanted. The conditions for implantation are the same as those for forming the low concentration n-type impurity region LNR.

Since the low concentration p-type impurity region LPR is formed only in the core region, referring to FIG. 29, a region which contains a compound containing a boron atom as a p-type impurity, for example, boron fluoride ($BF_2$), is formed. The conditions for implantation are the same as those for forming the low concentration n-type impurity region LNR.

Referring now to FIG. 30, p-type impurity regions PR1 and PR2 are formed as the source/drain region of each of the core transistor and the I/O transistor by implantation of impurities. Specifically, for example, the implantation of a compound of boron fluoride forms the p-type impurity region PR1, and the implantation of boron atoms forms the p-type impurity region PR2.

The boron fluoride atoms are preferably implanted, for example, in an application density of not less than $3 \times 10^{14}$ $cm^{-2}$ nor more than $3 \times 10^{15}$ $cm^{-2}$ in a planar view by applying an energy of, for example, not less than 1 keV nor more than 50 keV. The boron atoms are preferably implanted, for example, in an application density of not less than $5 \times 10^{12}$ $cm^{-2}$ nor more than $1 \times 10^{14}$ $cm^{-2}$ in a planar view by applying an energy of, for example, not less than 1 keV nor more than 50 keV. The angle at which each impurity is implanted is preferably in the direction substantially vertical to the main surface of the semiconductor substrate SUB.

In the above-mentioned way, the p-type impurity region PR comprised of the p-type impurity regions PR1 and PR2 and the low concentration p-type impurity region LPR are formed. The entire p-type impurity region PR in the I/O p-type transistor is preferably formed more deeply in the depth direction from the main surface of the semiconductor substrate SUB than the p-type impurity region in the core p-type transistor. More specifically, the p-type impurity region PR is preferably formed such that the depth of the entire p-type impurity region PR of the I/O transistor is 1.15 or more times larger than the depth of the entire p-type impurity region PR of the core transistor.

When forming the semiconductor device including the core n-type transistor, the I/O n-type transistor, the core p-type transistor, and the I/O p-type transistor, the entire n-type impurity region NR of the I/O n-type transistor is preferably deeper than the entire p-type impurity region PR of the I/O p-type transistor.

The formation of the p-type transistor differs from the formation of the n-type transistor in the above points.

Second Embodiment

This embodiment differs from the first embodiment in structure of a gate electrode and a channel region. Now, a semiconductor device of this embodiment will be described below.

Figure 32:
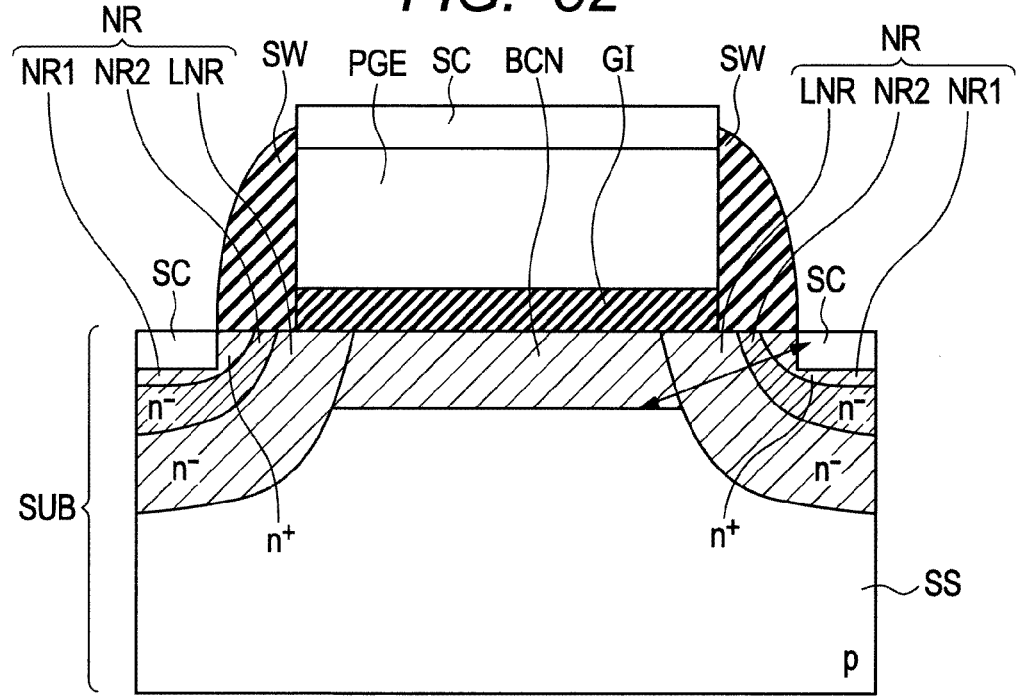
FIG. 32 is a schematic cross-sectional view showing the structure of an I/O n-type MOS transistor and the more detailed structure of the same type of n-type impurity region as that shown in FIG. 10, which are included in a semiconductor device according to a second embodiment of the invention.

Referring to FIG. 32, an I/O n-type transistor included in the semiconductor device of this embodiment includes a p-type gate electrode PGE containing p-type impurities. A channel region of the p-type support substrate SS located under the p-type gate electrode PGE and the gate insulating film GI is filled up with an embedded channel BCN (n-type impurity diffusion layer). The embedded channel BCN contains n-type impurities, such as arsenic.

The I/O n-type transistor shown in FIG. 32 differs from the I/O n-type transistor shown in FIG. 10 in the above points. Since this embodiment has substantially the same structure as that of the first embodiment except for the above points, in this embodiment, the same components as those described in the first embodiment are designated by the same reference numerals in FIG. 32, and a description thereof will be omitted below.

The I/O n-type transistor may also include the MOS transistor with the n-type gate electrode NGE described in the first embodiment, and the MOS transistor with the p-type gate electrode PGE.

When the I/O n-type transistor with the n-type gate electrode NGE and the I/O n-type transistor with the p-type gate electrode PGE are formed over the same semiconductor substrate SUB, the p-type gate electrode PGE generally has a high threshold voltage Vth as compared to the n-type gate electrode. Specifically, for example, the threshold voltage Vth of the I/O n-type transistor with the n-type gate electrode NGE shown in FIG. 10 is about 1 V. In contrast, the threshold voltage Vth of the I/O n-type transistor using the p-type gate electrode PGE instead of the n-type gate electrode NGE shown in FIG. 10 is about 2 V. The former is hereinafter regarded as the low-threshold-voltage I/O n-type transistor, while the latter is hereinafter regarded as the high-threshold-voltage I/O n-type transistor. This arrangement can form the semiconductor device having I/O n-type transistors with different threshold voltages intentionally formed over one semiconductor substrate SUB.

As shown in FIG. 32, the I/O n-type transistor including the p-type gate electrode PGE and the embedded channel BCN has a threshold voltage of about 1 V. Provision of the embedded channel BCN decreases the threshold voltage of the I/O n-type transistor. The embedded channel BCN is provided while the concentration of the n-type impurities contained in the embedded channel BCN is adjusted, which can arbitrarily adjust the threshold voltage of the I/O n-type transistor.

The lowermost part of the embedded channel BCN is preferably short from the main surface of the semiconductor substrate SUB (in the direction vertical to the main surface as shown in FIG. 32) as compared to the lowermost part of the n-type impurity region LNR. In other words, the lowermost part of the n-type impurity region LNR is preferably formed to extend up to a deep part of the semiconductor substrate SUB as compared to the lowermost part of the embedded channel BCN.

Next, the operation and effects of the semiconductor device of this embodiment with the core transistor and the I/O transistor will be described below. This embodiment has the following effects in addition to the effects described in the first embodiment.

As described above, the I/O n-type transistor includes the embedded channel BCN, whereby a distance from the silicide SC formed in the n-type impurity region NR up to a region inside the support substrate SS without the n-type impurities (but containing p-type impurities) becomes longer. As a result, a distance from the silicide SC to the depletion layer DPT formed outside the n-type impurity region NR or the like (see FIG. 17) becomes longer, like the first embodiment in which the n-type impurity region NR is formed deeply. The distance from the silicide SC to the n-type impurity region NR, especially, in the lateral direction shown in FIG. 32 corresponds to the distance designated by the arrow in FIG. 32. The distance is long as compared to the case where no embedded channel BCN exists.

The embedded channel BCN is disposed to couple the n-type impurity region NR as the source region and the n-type impurity region NR as the drain region via the n-type impurity region. Thus, the n-type impurity region is continuously formed from the source region to the drain region. The distance from the silicide SC in the drain region to the depletion layer can be very long, especially, in the lateral direction shown in FIG. 32. That is, the possibility that leak current flows through between the silicide SC and the depletion layer can be greatly decreased.

The embedded channel BCN is formed more deeply than the silicide SC, which can ensure the distance between the silicide SC and the depletion layer in the vertical direction shown in FIG. 32. As a result, the possibility that the leak current flows through between the silicide SC and the depletion layer can be greatly decreased.

Now, a manufacturing method of the semiconductor device DV of this embodiment will be described below. The manufacturing method of the semiconductor device DV of this embodiment is substantially the same as that of the first embodiment, and thus can be explained using FIGS. 21 to 31. Referring to FIG. 26, before forming the gate insulating film GIa, the embedded channel BCN is preferably formed inside the semiconductor substrate SUB directly under the region where the gate electrode of the I/O n-type transistor is to be formed. Specifically, like the first embodiment, n-type impurities, such as arsenic atoms, are ion-implanted. The energy of the implanted arsenic atoms is preferably as follows. For example, arsenic atoms are implanted by applying an energy of not less than 10 keV nor more than 150 keV. At this time, the arsenic atoms are preferably implanted, for example, in an application density of not less than $1\times10^{11}$ cm$^{-2}$ nor more than $1\times10^{13}$ cm$^{-2}$ in a planar view.

The gate insulating film GI and the gate electrode are formed as shown in FIG. 27 with the embedded channel BCN formed by the above steps. The thus-formed gate electrode is the p-type gate electrode PGE. Thus, the boron atoms are preferably ion-implanted as the impurity, in the same way as the case of forming the I/O p-type transistor in the first embodiment. The strength of energy at this time is preferably, for example, not less than 1 keV nor more than 10 keV. The range of application of the boron atoms is the same as that of implantation of the phosphorus atoms as the n-type impurity into the polycrystal silicon.

The manufacturing method of this embodiment differs form the manufacturing method of the first embodiment in the above steps. Thus, this embodiment is substantially the same as the first embodiment except for the above-mentioned steps.

In the above description, the form of the embedded channel BCN in the I/O n-type transistor has been given. However, the embedded channel may be embedded in the I/O p-type transistor. In this case, an embedded channel containing p-type impurities is formed. Thus, the leak current can be suppressed between the silicide and the depletion layer in the same manner as the case of forming the embedded channel BCN in the I/O n-type transistor. The threshold voltage of the I/O p-type transistor can be arbitrarily adjusted.

The second embodiment of the invention differs from the first embodiment of the invention only in the above-mentioned points. That is, all the structure, conditions, procedures, and effects not described above in the second embodiment of the invention are in conformity with the first embodiment of the invention.

Third Embodiment

This embodiment differs from the first embodiment in structure of impurity regions. Now, a semiconductor device of this embodiment will be described below.

Figure 33:
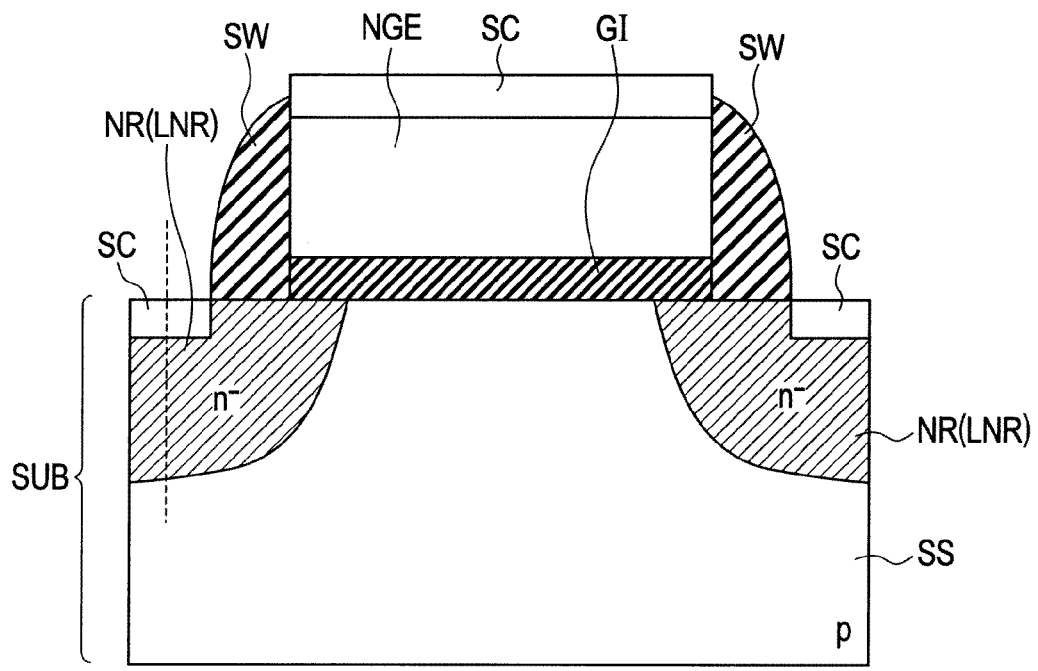
FIG. 33 is a schematic cross-sectional view showing the structure of an I/O n-type MOS transistor and the more detailed structure of the same type of n-type impurity region as that shown in FIG. 10, which are included in the semiconductor device according to a third embodiment of the invention.
Figure 34:
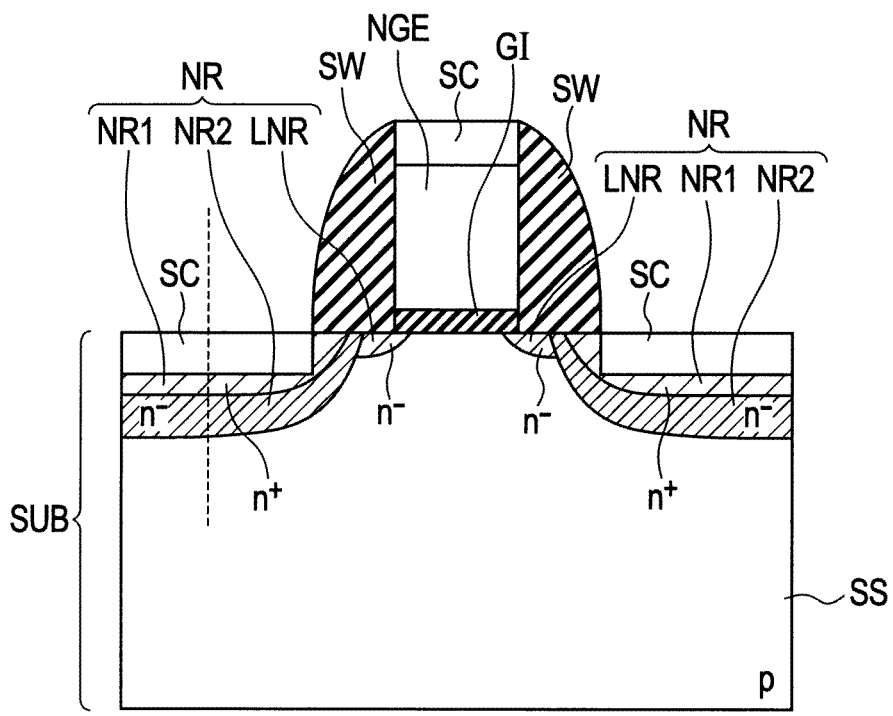
FIG. 34 is a schematic cross-sectional view showing the structure of a core n-type MOS transistor and the more detailed structure of the same type of n-type impurity region as that shown in FIG. 12, which are included in the semiconductor device according to the third embodiment of the invention.

Referring to FIGS. 33 and 34, an n-type impurity region NR of a core n-type transistor among the n-type transistors of this embodiment includes an n-type impurity region NR1 containing arsenic, and an n-type impurity region NR2 containing phosphorus. In contrast, an n-type impurity region NR of an I/O n-type transistor is comprised of only an impurity region containing phosphorus.

Figure 35:
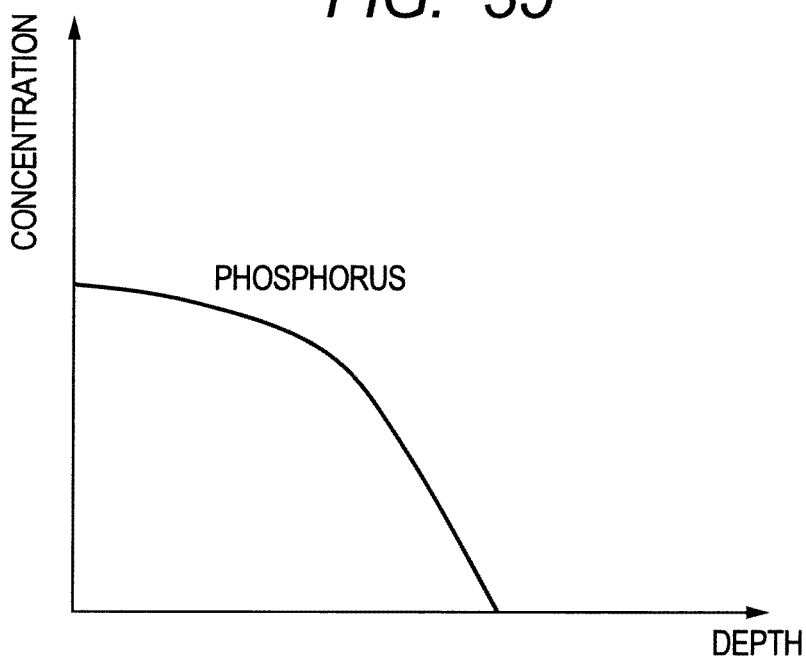
FIG. 35 is a graph showing the relationship between the type and concentration of impurities in each region inside the n-type impurity region shown in FIG. 33.
Figure 36:
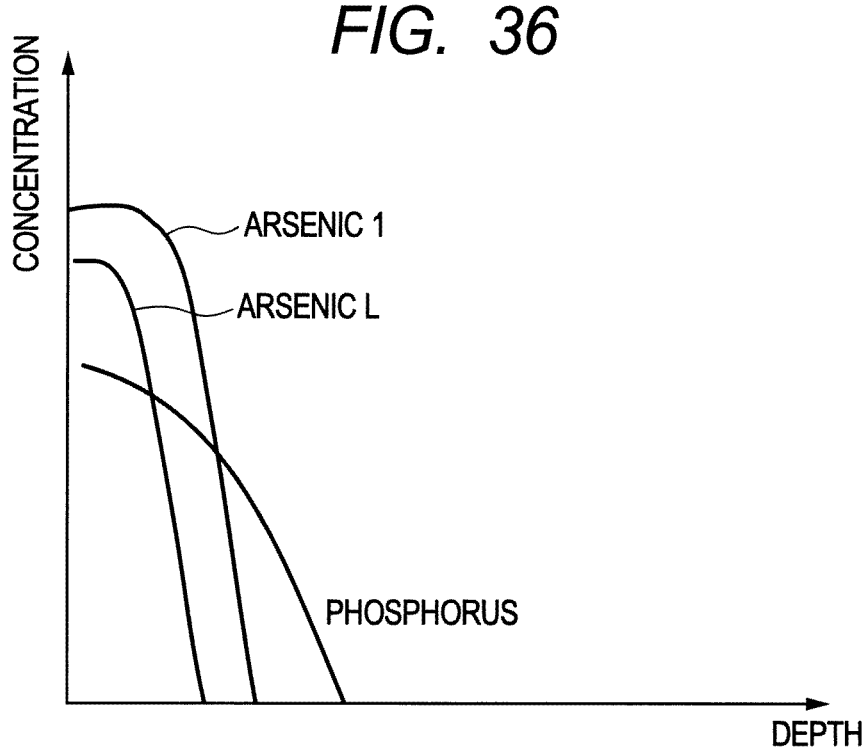
FIG. 36 is a graph showing the relationship between the type and concentration of impurities in each region inside the n-type impurity region shown in FIG. 34.

The horizontal axis of each of FIGS. 35 and 36 indicates the position (depth) in the direction (in the vertical direction) along a dotted line drawn on the n-type impurity region NR in each of FIGS. 33 and 34. The longitudinal axis of each of FIGS. 35 and 36 indicates the concentration of impurities in each position on the dotted line drawn on the n-type impurity region NR in each of FIGS. 33 and 34.

Referring to FIG. 35, the n-type impurity region NR of the I/O n-type transistor in this embodiment contains only phosphorus impurities. In contrast, referring now to FIG. 36, the n-type impurity region NR of the core transistor of this embodiment contains arsenic impurities included in the low concentration n-type impurity region LNR shown in FIG. 34, arsenic impurities included in the n-type impurity region NR1, and phosphorus impurities included in the n-type impurity region NR2. That is, the core n-type transistor of this embodiment is structured in the same manner as the core n-type transistor of the first embodiment.

The concentration of phosphorus contained in the n-type impurity region NR of the I/O n-type transistor in this embodiment is substantially equal to that of the low concentration n-type impurity region LNR of the I/O n-type transistor in the first embodiment. In other words, the n-type impurity region of the I/O n-type transistor of this embodiment is formed as an n-type impurity region NR whose depth and concentration are substantially the same as those of the low concentration n-type impurity region LNR of the I/O n-type transistor in the first embodiment.

That is, the core n-type transistor shown in FIG. 34 has the same structure as the core n-type transistor of the first embodiment shown in FIG. 12. Thus, the n-type transistor of this embodiment differs from the first embodiment only in I/O n-type transistor. And, the n-type transistor of this embodiment is the same as that of the first embodiment.

Reference character "arsenic L" shown in FIG. 36 indicates the concentration of arsenic impurities in the low concentration n-type impurity region LNR of the core n-type transistor shown in FIG. 34, and reference character "arsenic 1" indicates the concentration of arsenic impurities in the n-type impurity region NR1 shown in FIG. 34. It is noted that the arsenic materials indicated by both reference characters are the same.

Figure 37:
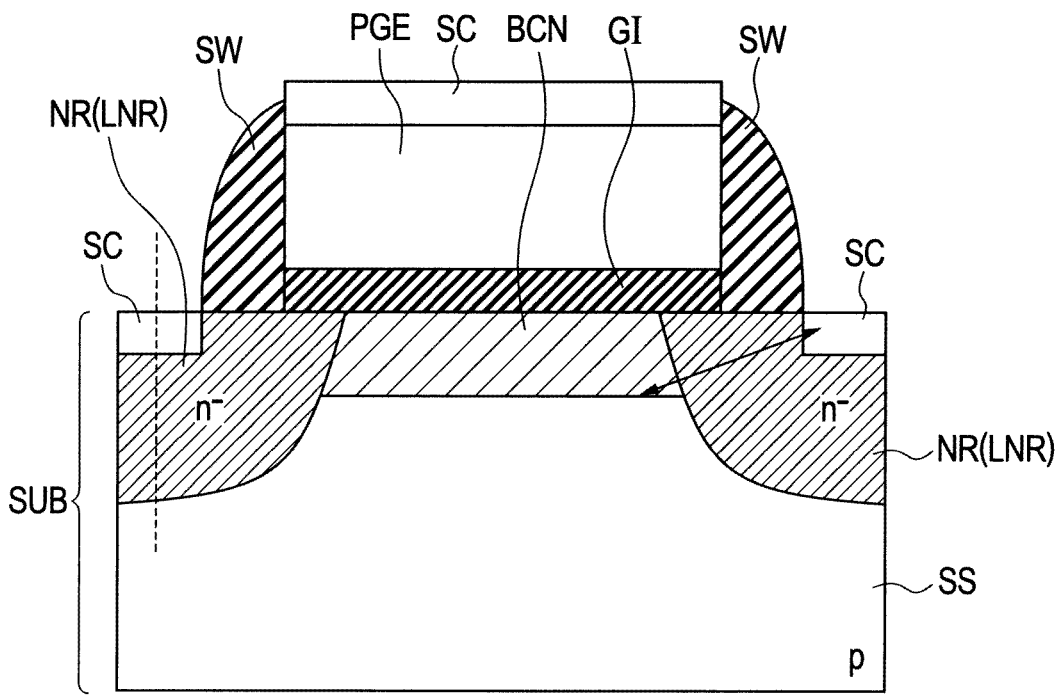
FIG. 37 is a schematic cross-sectional view showing a modified example of the I/O n-type MOS transistor having a different structure from that shown in FIG. 33 and included in the semiconductor device according to the third embodiment of the invention.

Referring to FIG. 37, an embedded channel BCN containing, for example, arsenic impurities, may be formed in the same way as that shown in FIG. 32, as a modified example of the I/O n-type transistor with the same structure as that shown in FIG. 33 of this embodiment. The gate electrode may be comprised of a p-type gate electrode PGE.

The n-type transistor of this embodiment differs from the n-type transistor of the first embodiment in the above-mentioned points. Since this embodiment has substantially the same structure as that of the first embodiment except for the above points, in this embodiment, the same components as those described in the first embodiment are designated by the same reference numerals in FIGS. 33 to 39, and a description thereof will be omitted below.

Next, the operation and effects of the semiconductor device including the core transistor and the I/O transistor of this embodiment will be described below. This embodiment has the following effects in addition to the effects described in the first embodiment.

The n-type impurity region NR comprised of the low concentration n-type impurity region containing phosphorus in such a transistor as the I/O n-type transistor of this embodiment has a low concentration of impurities, especially, in a shallow region in the vicinity of the main surface of the semiconductor substrate SUB, as compared to the I/O n-type transistor of the first embodiment or the core n-type transistor of the respective embodiments. This embodiment can improve the breakdown voltage that can drive the transistor with respect to the drain voltage to which the transistor is applied.

Figure 38:
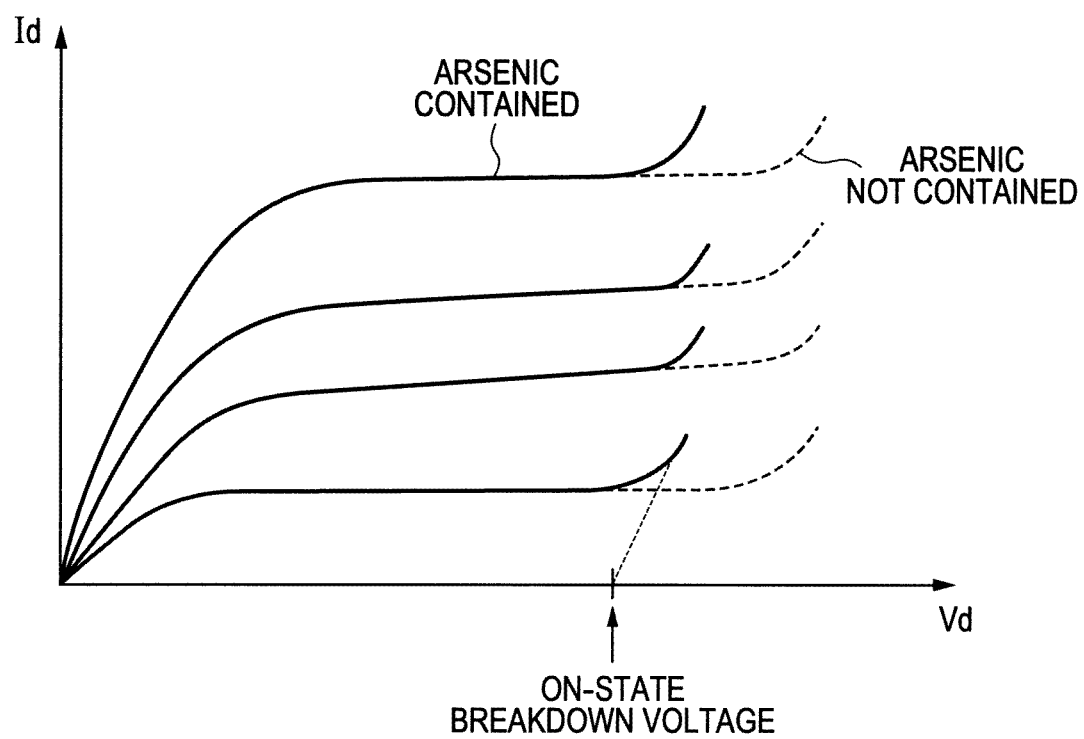
FIG. 38 is a graph showing the relationship between a drain voltage and a drain current in a case where the n-type impurity region contains arsenic and also in a case where the n-type impurity region does not contain arsenic.

The horizontal axis of the graph in FIG. 38 indicates the level of a drain voltage which is applied to the drain region with respect to the source region. The longitudinal axis of the graph indicates the level of a drain current flowing through between the source region and the drain region. FIG. 38 illustrates a plurality of data curves. As the curve is located upward, the gate voltage which is applied to the gate electrode becomes higher.

Among the respective curves, the solid line indicates data obtained when the n-type impurity region NR of the I/O n-type transistor also contains arsenic impurities like the first embodiment. Among the respective curves, the dotted line indicates data obtained when the n-type impurity region NR of the I/O n-type transistor contains only phosphorus impurities, like this embodiment.

FIG. 38 shows that the I/O n-type transistor with the n-type impurity region NR not containing arsenic impurities has a high drain voltage (ON-state breakdown voltage) allowable in driving as compared to the I/O n-type transistor with the n-type impurity region containing arsenic impurities. As mentioned above, the improvement of the ON-state breakdown voltage of the drain voltage improves the functions of the entire semiconductor device DV.

The above-mentioned effect of improving the breakdown voltage is exhibited when the concentration of impurities in the n-type impurity region NR, especially, in the shallow region near the main surface of the semiconductor substrate SUB is low. Further, like this embodiment, one kind of impurity contained in the n-type impurity region NR is preferably phosphorus which tends to be easily diffused.

As shown in FIG. 37, the embedded channel BCN is provided and the n-type impurity region NR contains only phosphorus impurities in a small concentration, which can suppress the generation of leak current between the silicide SC and the n-type impurity region NR, like the second embodiment.

A manufacturing method of the semiconductor device DV in this embodiment will be described below. The manufacturing method of the semiconductor device DV in this embodiment is substantially the same as the manufacturing method of the first embodiment, and thus can be explained using FIGS. 21 to 31. In this embodiment, however, then-type impurity region NR1 and the n-type impurity region NR2 shown in FIG. 30 are formed only in the core transistor, and not in the I/O transistor.

Figure 39:
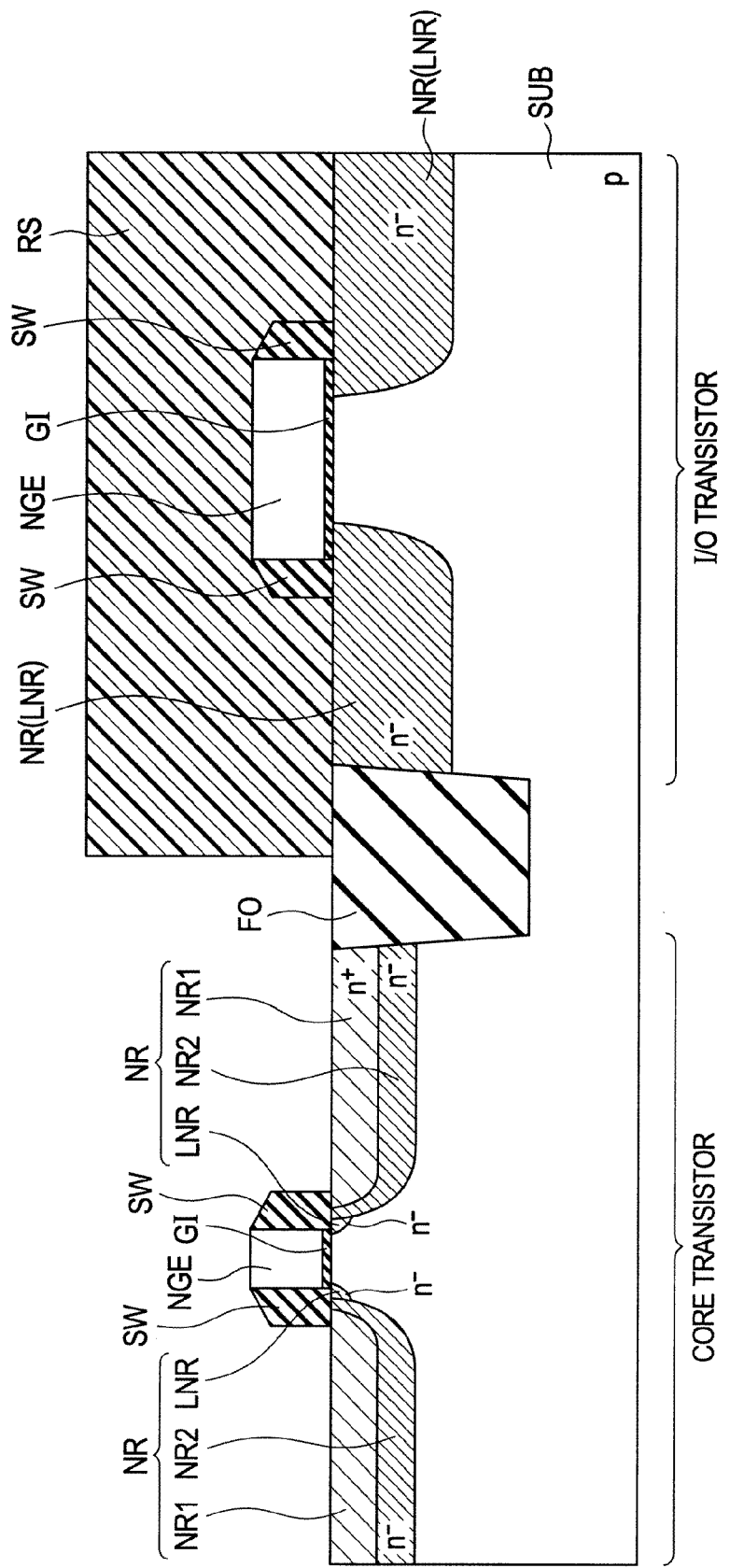
FIG. 39 is a schematic cross-sectional view showing the same step as that shown in FIG. 30 in the manufacturing method of the semiconductor device according to the third embodiment.

Specifically, referring to FIG. 39, the n-type gate electrode NGE is formed in the same way as that shown in FIG. 30. A photoresist RS is applied only over the I/O n-type transistor with the low concentration n-type impurity region LNR of the I/O transistor containing phosphorus impurities. In this state, n-type impurity regions NR1 and NR2 are formed as the source/drain region in desired positions of the core n-type transistor in the same process as that in the first embodiment.

In this way, the n-type impurity region NR containing phosphorus and arsenic is formed only in the core n-type transistor, and the n-type impurity region NR containing only phosphorus is formed in the I/O n-type transistor.

The conditions for ion implantation in forming the n-type impurity regions NR1 and NR2 only in the core n-type transistor are the same as those of the first embodiment.

The third embodiment of the invention differs from the first embodiment of the invention only in the above-mentioned respective points. That is, all the structure, conditions, procedures, and effects not described above in the third embodiment of the invention are in conformity with the first embodiment of the invention.

The embodiments disclosed herein are for illustrative purposes only, and should not be construed to narrow the breadth of the present disclosure in any way. The scope of the present invention is not limited to the above description and represented by the appended claims. It is intended that various changes and modification can be made to the disclosed embodiments without departing from the spirit and scope of the appended claims and their equivalents.

The invention is advantageously applied to, especially, a semiconductor device including a semiconductor element for forming a logic circuit and another semiconductor element for forming an input/output circuit, and to a manufacturing method thereof.

What is claimed is:

1. A semiconductor device, comprising:
a semiconductor substrate with a main surface;
an n-channel first transistor and a p-channel second transistor formed over the main surface and adapted to form a logic circuit; and
an n-channel third transistor and a p-channel fourth transistor formed over the main surface and adapted to form an input/output circuit,
wherein the first and third transistors have n-type source and drain regions,
wherein the second and fourth transistors have p-type source and drain regions,
wherein a distance from the main surface to a lowermost part of the source and drain regions of the third transistor is longer than that from the main surface to a lowermost part of the source and drain regions of the first transistor,
wherein a distance from the main surface to a lowermost part of the source and drain regions of the fourth transistor is longer than that from the main surface to a lowermost part of the source and drain regions of the second transistor, and
wherein a distance from the main surface to the lowermost part of the source and drain regions of the third transistor is longer than that from the main surface to the lowermost part of the source and drain regions of the fourth transistor.

2. The semiconductor device according to claim 1, wherein the distance from the main surface to the lowermost part of the source and drain regions of the third transistor is 1.4 or more times larger than that from the main surface to the lowermost part of the source and drain regions of the first transistor.

3. The semiconductor device according to claim 1, wherein the distance from the main surface to the lowermost part of the source and drain regions of the fourth transistor is 1.15 or more times larger than that from the main surface to the lowermost part of the source and drain regions of the second transistor.

4. The semiconductor device according to claim 1, wherein the third transistor includes an n-type gate electrode or a p-type gate electrode, wherein an n-type impurity diffusion layer is provided under the p-type gate electrode.

5. The semiconductor device according to claim 4, wherein a distance from the main surface to a lowermost part of the impurity diffusion layer is shorter than that from the main surface to the lowermost part of the source and drain regions.

6. The semiconductor device according to claim 1, wherein the source and drain regions included in the first transistor contains arsenic and phosphorus as an impurity, and
wherein the source and drain regions included in the third transistor contains only phosphorus as the impurity.

7. A manufacturing method of a semiconductor device, comprising:
providing a semiconductor substrate with a main surface;
forming an n-channel first transistor and a p-channel second transistor as a logic circuit over the main surface; and
forming an n-channel third transistor and a p-channel fourth transistor as an input/output circuit over the main surface,
wherein the forming the first and third transistors includes forming n-type source and drain regions,
wherein the forming the second and fourth transistors includes forming p-type source and drain regions,
wherein a distance from the main surface to a lowermost part of the source and drain regions of the third transistor is longer than that from the main surface to a lowermost part of the source and drain regions of the first transistor,
wherein a distance from the main surface to a lowermost part of the source and drain regions of the fourth transistor is longer than that from the main surface to a lowermost part of the source and drain regions of the second transistor, and
wherein a distance from the main surface to the lowermost part of the source and drain regions of the third transistor is longer than that from the main surface to the lowermost part of the source and drain regions of the fourth transistor.

8. The manufacturing method of a semiconductor device according to claim 7,
wherein the source and drain regions are formed by implanting ions of impurities, and
wherein the ions are implanted in an oblique direction with respect to the main surface.

9. The manufacturing method of a semiconductor device according to claim 7,
wherein the source and drain regions are formed by implanting ions of impurities,
wherein the source and drain regions included in the first transistor are formed to contain arsenic and phosphorus as the impurity, and
wherein the source and drain regions included in the third transistor are formed to contain phosphorus as the impurity.

10. The manufacturing method of a semiconductor device according to claim 7, wherein the distance from the main surface to the lowermost part of the source and drain regions of the third transistor is 1.4 or more times larger than that from the main surface to the lowermost part of the source and drain regions of the first transistor.

11. The manufacturing method of a semiconductor device according to claim 7, wherein the distance from the main surface to the lowermost part of the source and drain regions of the fourth transistor is 1.15 or more times larger than that from the main surface to the lowermost part of the source and drain regions of the second transistor.

12. The manufacturing method of a semiconductor device according to claim 7, wherein the third transistor is formed with an n-type gate electrode or a p-type gate electrode, and further comprising the step of forming the n-type impurity diffusion layer under the p-type gate electrodes.

* * * * *